US012596302B2

United States Patent

(12) United States Patent
Liang et al.

(10) Patent No.: US 12,596,302 B2
(45) Date of Patent: Apr. 7, 2026

(54) CROSSTALK REDUCTION OF MICROCAPSULE IMAGING SYSTEM

(71) Applicant: Polaroid IP B.V., Enschede (NL)

(72) Inventors: Rong-Chang Liang, Cupertino, CA (US); Wei You, Taichung City (TW); Chun-Jen Chen, New Taipei City (TW)

(73) Assignee: POLAROID IP B. V., Enschede (NL)

( * ) Notice: Subject to any disclaimer, the term of this patent is extended or adjusted under 35 U.S.C. 154(b) by 299 days.

(21) Appl. No.: 18/074,412

(22) Filed: Dec. 2, 2022

(65) Prior Publication Data

US 2024/0184198 A1 Jun. 6, 2024

(51) Int. Cl.

| | |
|---|---|
| ***G03F 7/00*** | (2006.01) |
| ***C09B 67/02*** | (2006.01) |
| ***G03F 7/105*** | (2006.01) |
| *B41M 5/165* | (2006.01) |
| *B41M 5/28* | (2006.01) |

(52) U.S. Cl.

CPC .......... *G03F 7/002* (2013.01); *C09B 67/0097* (2013.01); *G03F 7/105* (2013.01); *B41M 5/165* (2013.01); *B41M 5/287* (2013.01)

(58) Field of Classification Search

CPC ... B41M 5/165; B41M 5/287; C09B 67/0097; G03F 7/002; G03F 7/105

See application file for complete search history.

(56) References Cited

U.S. PATENT DOCUMENTS

| | | | |
|---|---|---|---|
| 4,399,209 A | 8/1983 | Sanders et al. | |
| 4,416,966 A | 11/1983 | Sanders et al. | |
| 4,440,846 A | 4/1984 | Sanders et al. | |
| 4,536,463 A | 8/1985 | Sanders | |
| 4,554,235 A | 11/1985 | Adair et al. | |
| 4,766,050 A | 8/1988 | Jerry | |
| 4,772,541 A | 9/1988 | Gottschalk et al. | |
| 4,895,880 A | 1/1990 | Gottschalk et al. | |
| 4,962,010 A | 10/1990 | Colyer et al. | |
| 4,968,580 A | 11/1990 | Lee et al. | |
| 5,053,309 A * | 10/1991 | Sanders | G03C 7/46 430/365 |
| 5,100,755 A | 3/1992 | Shanklin | |
| 5,120,475 A | 6/1992 | Chen et al. | |

(Continued)

FOREIGN PATENT DOCUMENTS

| | | |
|---|---|---|
| CA | 2354784 A1 | 2/2002 |
| JP | 2001-018529 A | 1/2001 |

OTHER PUBLICATIONS

Daintith, John, "Antioxidants" in "A Dictionary of Chemistry", 2008 (Year: 2008).*

(Continued)

*Primary Examiner* — Gerard Higgins

(74) *Attorney, Agent, or Firm* — Kiri Lee Sharon; Foley & Lardner LLP

(57) ABSTRACT

Microcapsules including a color-filtering shell and a core comprising a leuco dye or dye precursor, a photoinitiator or photosensitizer, and a photohardenable or photosoftenable material are provided for use in microcapsule imaging sheets. The imaging sheets including such microcapsules reduce undesirable crosstalk among the microcapsules of various colors and provide significantly improved color fidelity of the image thus reproduced.

34 Claims, 7 Drawing Sheets

(56) References Cited

U.S. PATENT DOCUMENTS

| | | | | |
|---|---|---|---|---|
| 5,230,982 | A | 7/1993 | Davis et al. | |
| 5,525,686 | A | 6/1996 | Tanabe et al. | |
| 5,739,840 | A * | 4/1998 | Imai | B41J 2/48 347/133 |
| 5,783,353 | A | 7/1998 | Camillus et al. | |
| RE37,257 | E | 7/2001 | Sanders | |
| 6,326,120 | B1 | 12/2001 | Wang et al. | |
| 6,468,708 | B1 | 10/2002 | Wang et al. | |
| 6,620,571 | B2 | 9/2003 | Katampe et al. | |
| 6,740,465 | B2 | 5/2004 | Liang et al. | |
| 7,153,628 | B2 | 12/2006 | Liu et al. | |
| 2005/0084790 | A1 | 4/2005 | Schroeder et al. | |

OTHER PUBLICATIONS

Arney et al., Grey Scale Characteristics of the Microencapsulated Acrylate Process of Imaging, Mead Imaging (1990) (12 pages).
Camillus et al. "Exposing Cycolor Film using Telegen's New Linear Head", Proc. International Conference Digital Printing Tech., NIP & Digital Fabrication, p. 441-444 (2002).
Cycolor Definition, PC Magazine (© 2019, accessed Apr. 2019) (3 pages).
Gregory, "High-Technology Applications of Organic Colorants", Ch.8, Plenum Press (1991) (53 pages).
Muthyyala ed., "Chemistry and Applications of Leuco Dyes", Ch. 4, Plenum Press (1997) (29 pages).
Rastogi et al., Cycolor Imaging Technology, Mead Imaging, SPIE Proc., vol. 1079, p. 183 (1989) (32 pages).
International Search Report and Written Opinion for International Application No. PCT/IB2023/061990, mailing date Mar. 14, 2024, 16 pages.

* cited by examiner

Pigment Yellow 155

Pigment Violet 19

CROSSTALK REDUCTION OF MICROCAPSULE IMAGING SYSTEM

FIELD

The present disclosure relates generally to the field of microcapsule imaging systems and more particularly to microcapsules having a color-filtering shell for use in the same.

BACKGROUND

Single-sheet, self-containing, full-color microcapsule imaging systems (e.g., CYCOLOR® made by Mead Corp. of Miamisburg, OH) have been developed since the 1980s. In these imaging systems, an imaging sheet including a layer of microcapsules comprising a photo-hardenable or photo-softenable material or composition and a leuco dye in the internal phase is image-wise exposed to actinic radiation. Typically, the photosensitive composition comprises a photopolymerizable, multifunctional acrylate, a photoinitiator, and a color former. Generally, the microcapsules are image-wise hardened by actinic radiation, and upon passing the exposed imaging sheet through a pressure roller, the microcapsules may be image-wise ruptured to release the internal phase encapsulated therein. The leuco dyes that are thus released migrate to a developer material and react to form a continuous-tone, full-color image with its color density (or grayscale) modulated by the exposure energy (time or pulse width), intensity (pulse amplitude), and/or pulse frequency. Such self-contained, single-sheet imaging systems are utilizable for lightweight, portable, high-speed printing applications.

A positive image is typically obtained by such a photo-hardening microcapsule imaging system. In contrast, a negative image may be obtained by a photo-softening microcapsule imaging system or through alternative techniques.

In addition to the single-sheet self-containing system, a microcapsule imaging system may comprise two separate sheets, a microcapsule sheet and dye developer sheet. Positive images may also be obtained by image-wise exposing the microcapsule sheet to form a latent image and subsequently rupture the microcapsules and transfer the released leuco dyes to the developer sheet to develop the images thereon.

SUMMARY

The image quality of a photosensitive imaging system including the above-mentioned microcapsule imaging system is heavily dependent on the spectra sensitivities of the three microcapsules and the emission spectra of the light sources used. For instance, in a full-color microcapsule imaging system that uses red (R)-, green (G)- and blue (B)-sensitive photoinitiators such as cyanine borate initiators and R-, G- and B-light sources (e.g., R-, G- and B-LED or OLED used in a LED or OLED display or R-, G- and B-light passing through color filters in LCD displays), there is significant overlap of the absorption spectra of B- and G-photoinitiators in the 440~500 nm range. Similarly, there is also significant overlap of the absorption spectra of G- and R-photoinitiators in the 540~600 nm range. Also, there are significant overlaps of the R-, G-, B-emission spectra of the light sources from the OLED or LCD displays. As such, exposing the imaging sheet with a light of wavelength in the overlap range may cause crosstalk by hardening more than one types of capsules.

The fidelity of the color reproduction process can deteriorate if crosstalk of any photoreactions occurs, e.g., if more than one type of microcapsule is hardened when the system is written by only one light source or one type of microcapsules is hardened by more than one light sources. The color of the printed image can then be contaminated by unwanted color(s) and the color gamut can be significantly deteriorated. As such, photosensitizers/initiators of a narrow and well-separated spectra sensitivity and light sources of narrow bandwidth and well-separated emission spectra appropriately matched to the spectrum sensitivity of the corresponding photosensitizers/initiators are highly desirable for a high-quality color reproduction.

Unfortunately, most photoinitiators or photosensitizers exhibit a very broad spectrum sensitivity and most modulate-able light sources including self-emitting OLED and back-light LCDs with R-, G-, B-color filters show very broad emission spectra. Severe crosstalk is observed when a microcapsule imaging media with a typical spectrum sensitivity is printed with such a broad band light source. Semiconductor light emitting devices including LEDs and lasers exhibit relatively narrower emission spectra. Unfortunately, only a very limited choice of LEDs or lasers with acceptable $\lambda_{max}$, size and power efficiency are available in the market and the cost is often very high for printing applications.

On the other hand, it is also very difficult to find a set of R-, G-, B-photoinitiators with a narrow band absorption spectrum. In fact, cyanine borate photoinitiators were selected for microcapsule imaging systems mainly because of their high thermal stability and quantum efficiency as well as relatively narrow absorption spectra. However, even with the cyanine borate photoinitiators, severe crosstalk was still observed. Most of other known photosensitizers or photoinitiators exhibit a much broader absorption spectrum and worse quantum efficiency than the cyanine borate photoinitiators that are commonly used.

Even if all three well matched pairs of photoinitiator and light source are identified, the requirements of high quantum efficiency of the photosensitizers/initiators and high-power output of light sources for high-speed printing applications further make the task extremely difficult and costly, if not impossible. Thus, there remains an unmet need for an effective and low-cost solution to reduce or eliminate crosstalk for high quality printing.

This disclosure relates to an improved full-color microcapsule imaging system that utilizes photosensitive microcapsules comprising a color-filtering shell or a shell capable of filtering off incipient light of undesirable wavelengths. The color-filtering shell greatly reduces undesirable crosstalk among the microcapsules of various color and significantly improve the color fidelity of the image thus reproduced. It is particularly beneficial to the digital imaging system since the microcapsules described herein greatly reduce the need for selecting light sources of emission wavelengths that are perfectly matched to the spectrum sensitivities of the photosensitizers/initiators used in the microcapsules. Fine-tuning the emission spectra of the light sources such as LEDs or OLEDs or the absorption spectra of the photosensitizers/initiators while maintaining their quantum efficiency is difficult to achieve, if not impossible. The disclosure provides an effective and low-cost solution to greatly reduce undesirable crosstalk and improve the color image fidelity of the microcapsule imaging systems.

In one aspect, which may be combined with any other aspect or embodiment, the present disclosure relates to a photosensitive microcapsule for a microcapsule imaging sheet, comprising a color-filtering shell; and a core comprising a leuco dye or dye precursor, a photoinitiator or photosensitizer, and a photohardenable or photosoftenable material.

In some embodiments, the photohardenable material comprises a photopolymerizable or crosslinkable monomer or oligomer. In some embodiments, the polymerizable or crosslinkable monomer or oligomer is selected from a multifunctional acrylate or methacrylate, multifunctional vinyl ether, multifunctional allyl or vinylbenzene, and the oligomer, dendrimer or blend thereof.

In some embodiments, the multifunctional acrylate is pentaerythritol triacrylate (PETA-3), pentaerythritol tetraacrylate (PETA-4), dipentaerythritol hexaacrylate (DPHA), dipentaerythritol pentaacrylate (DPPA), trimethylolpropane triacrylate (TMPTA), 1,6-hexanediol diacrylate (HDDA), tripropylene glycol diacrylate (TPGDA), or neopentyl glycol diacrylate (NPGDA).

In some embodiments, the photosoftenable material comprises a photodegradable or photo-depolymerizable polymer.

In some embodiments, the leuco dye is a cyan, magenta, yellow, black leuco dye, or any combination thereof. In some embodiments, the photoinitiator is a red-sensitive, green-sensitive, or blue-sensitive cyanine borate, semi-cyanine borate, or ketocoumarin. In some embodiments, the photoinitiator is a borate of cyanine, semi-cyanine borate, triarylmethane, squarylium or thiopyrylium dye. In some embodiments, the photoinitiator or photosensitizer comprises a UV-sensitive, blue-sensitive, green-sensitive, red-sensitive, or near-IR-sensitive photoinitiator or sensitizer.

In some embodiments, the photosensitive microcapsule is sensitive to a specific color or a specific range of radiation spectrum, and the shell comprises one or more of a color-filtering dye or pigment that allow a wavelength corresponding to the color or a range of radiation spectrum to pass through to the core but selectively absorb or filter off all or a portion of the radiation outside of the specific color or range. In some embodiments, the one or more of color-filtering dye or pigment is bleachable. In some embodiments, the one or more of color-filtering dye or pigment is thermal or photo-bleachable.

In some embodiments, the specific color or range is red, green, blue, cyan, magenta or yellow. In some embodiments, the range of radiation spectrum is from about 330 nm to about 900 nm.

In some embodiments, the one or more of color-filtering dye or pigment comprises a functional group to react with one or more shell-forming materials. In some embodiments, the functional group is selected from a group comprising —OH, —SH, —$NH_2$, —N—HR, —$CH_2OH$, —$CH_2OR$, —CHO, —$CONH_2$, —CONHR, urea, thiourea, isocyanate, thioisocyanate, epoxide, and their precursors, wherein R is alkyl, aryl, arylalkyl, alkylaryl or their heteroatom derivatives, particularly those with a short chain length. In some embodiments, the functional group is selected from a group comprising —OH, —SH, —$NH_2$, —N—HR, —$CONH_2$, —NCO, —NCS—, —$CH_2OH$, —$CH_2OR$, —CHO, and their precursors, wherein R is alkyl, aryl, arylalkyl, alkylaryl or their heteroatom derivatives.

In some embodiments, the one or more shell-forming materials are included in the internal phase or oil phase and form a shell by interfacial polymerization or crosslinking during the microencapsulation process. In some embodiments, the one or more shell-forming materials are included in the internal phase and/or external phase and form a shell by interfacial polymerization or crosslinking during the microencapsulation process. In some embodiments, the one or more shell-forming materials included in the oil or internal phases are selected from a group comprising multifunctional isocyanate, thioisocyanate, and epoxide, or their precursors.

In some embodiments, one or more shell-forming materials are included in the external phase or aqueous phase and form a shell by interfacial or in situ polymerization or crosslinking, phase separation, or coacervation during the microencapsulation process. In some embodiments, the one or more shell-forming materials in the external phase or aqueous phase are water-soluble compounds comprising reactive functional groups including but are not limited to, —OH, —SH, —$NH_2$, —N—HR, —COOH, —$CH_2OR$, —CHO or their precursors, wherein R is alkyl, aryl, arylalkyl, alkylaryl or their heteroatom derivatives, particularly those with a short chain length (e.g., those having an alkyl chain comprising one to four carbons). In some embodiments, the one or more shell-forming materials are selected from a group comprising urea, amine, urea formaldehyde, melamine formaldehyde, poly(N-methylol acrylamide), gelatin, gum Arabic, pectin, carboxylate methyl cellulose, and their oligomers, copolymers or blends thereof.

In some embodiments, the color-filtering shell comprises one or more of a color-filtering dye or pigment. In some embodiments, the color-filtering dye is thermo- or photo-bleachable.

In some embodiments, the photoinitiator or photosensitizer is red-sensitive and the color of the color filtering shell is magenta, yellow or their combinations. In some embodiments, the photoinitiator or photosensitizer is green-sensitive and the color of the color-filtering shell is cyan, yellow, or any combination thereof. In some embodiments, the photoinitiator or photosensitizer is blue-sensitive and the color of the color-filtering shell is magenta, cyan, or any combination thereof. In some embodiments, the photoinitiator or photosensitizer is IR-sensitive and the color of the color-filtering shell is cyan, magenta, yellow or any combination thereof.

In some embodiments, the color-filtering dye or pigment is a magenta (green-absorbing) and/or cyan (red-absorbing) dye or pigment for blue-sensitive microcapsules.

In some embodiments, the color-filtering dye or pigment is a yellow (blue-absorbing) and/or cyan (red-absorbing) dye or pigment for the green-sensitive microcapsules. In some embodiments, the color-filtering dye or pigment is Yellow Pigment 155 or CI Direct Yellow 86.

In some embodiments, the color-filtering dye or pigment is a yellow (blue-absorbing) and/or magenta (green-absorbing) dye or pigment for the red-sensitive microcapsules. In some embodiments, the color-filtering dye or pigment is Pigment Violet 19 or CI Dispersed Red 60.

In some embodiments, the one or more of a color-filtering dye or pigment present in the microcapsule is in amount of from about 0.01 to about 3 phi (parts per hundred internal phase or parts per hundred core by weight). In some embodiments, the one or more of a color-filtering dye or pigment present in the microcapsule is in amount of from about 0.05 to about 1.0 phi.

In some embodiments, when the photosensitive microcapsules are green-sensitive or red-sensitive microcapsules and the one or more color-filtering dye or pigment comprises a yellow (blue-absorbing) color-filtering dye or pigment with a total absorption optical density of from about 0.005 to about 0.3, preferably from about 0.05 to about 0.2 in the range of about 450 to about 500 nm. Dependent on the extinction coefficient, the concentration of the dyes or pigments used in the shell is from about 0.05 to about 2 phi, preferably from about 0.1 to about 1 phi.

In some embodiments, when the photosensitive microcapsules are blue-sensitive or red-sensitive microcapsules and the one or more color-filtering dye or pigment is a magenta (green-absorbing) color-filtering dye or pigment, the absorption optical density is from about 0.005 to about 0.3, preferably from about 0.05 to about 0.2 in the range of about 550 to about 600 nm. Dependent on the extinction coefficient, the concentration of the dyes or pigments used in the shell is from about 0.05 to about 2 phi, preferably from about 0.1 to about 1 phi.

In some embodiments, the photosensitive microcapsule has an average diameter or $D_{50}$ from about 4.0 μm to about 9.0 μm. In some embodiments, the photosensitive microcapsule has an average diameter or $D_{50}$ from about 5.0 μm to about 6.5 μm. In some embodiments, the core does not comprise any color-filtering dye or pigment.

In some embodiments, the core further comprises a radical inhibitor, retarder or antioxidant. In some embodiments, the radical inhibitor, antioxidant, or retarder is selected from a group comprising phenols, anilines, N-oxide of hindered amines, CuO, copper dithiocarbamate, copper or manganese carboxylates, and thiuram (thiocarbamoyl) derivatives such as

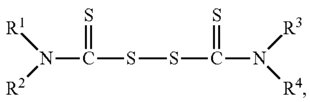

wherein each of $R^1$, $R^2$, $R^3$, and $R^4$ is independently an alkyl group having the carbon number of 1 to 8 or a phenyl group.

In some embodiments, the radical inhibitor is a phenol radical inhibitor selected from a list comprising alkyl gallate, butyl hydroxy anisole, 3,5-di-t-butylbutyl-4-hydroxytoluene, Vitamin E, 3,4-dihydro-2,5,7,8-tetramethyl-2-(4,8,12-trimethyltridecyl)-2H-1-benzopyran-6-ol (IRGANOX® E201), triethylene glycol bis(3-tert-butyl-4-hydroxy-5-methylphenyl)propionate (IRGANOX® 245), 3-{[3-(3,5-di-tert-butyl-4-hydroxyphenyl)propanoyl]oxy}-2,2-bis({[3-(3,5-di-tert-butyl-4hydroxyphenyl)propanoyl]-oxy}methyl)-propyl 3-(3,5-di-tert-butyl-4-hydroxyphenyl)propanoate (IRGANOX® 1010), 1,2-Bis(3,5-di-tert-butyl-4-hydroxy-hydrocinnamoyl)hydrazine (IRGANOX® MD 1024, 1,3,5-trimethyl-2,4,6-tris(3,5-di-tert-butyl-4-hydroxybenzyl)benzene (IRGANOX® 1076), 2,2'-Thiobis(6-tert-butyl-p-cresol) (IRGANOX® 1081), N,N'-hexane-1,6-diylbis(3-3,5-di-tert-butyl-4-hydroxyphenyl-propionamide) (IRGANOX® 1098), 3,5-bis(1,1-dimethylethyl)-4-hydroxybenzenepropanoic acid thiodi-2,1-ethanediyl ester (IRGANOX® 1035), benzenepropanoic acid, 3,5-bis(1,1-dimethyl-ethyl)-4-hydroxy-C7-C9 branched alkyl esters (IRGANOX® 1135), 3,3',3',5,5',5'-hexa-tert-butyl-a,a',a'-(mesitylene-2,4,6-triyl)tri-p-cresol (IRGANOX® 1330), (1,1-di-tert-butyl)-4-hydroxyphenyl)methyl)ethylphosphonate) (IRGANOX® 1425), 1,3,5-tris[4-hydroxy-3,5-bis(2-methyl-2-propanyl)benzyl]-1,3,5-triazinane-2,4,6-trione (IRGANOX® 3114), 2,6-di-tert-butyl-4~(4,6-bis(octylthio)-1,3,5-triazin-2-ylamino) phenol (IRGANOX® 565), and other IRGANOX® primary antioxidants.

In some embodiments, the radical inhibitor is a N-oxide of hindered amine, wherein the hindered amine is selected from the list comprising bis(2,2,6,6-tetramethyl-4-piperidyl) sebaceate (Tinuvin 770 DF), bis(1,2,2,6,6-pentamethyl-4-piperidyl) sebacate (ADK STAB LA-72), tetrakis(2,2,6,6-tetramethyl-4-piperidyl) butane-1,2,3,4-tetracarboxylate (ADK STAB LA-57), and bis(1-undecanoxy-2,2,6,6-tetramethylpiperidin-4-yl)carbonate (ADK STAB LA-81).

In some embodiments, the radical inhibitor, retarder or antioxidant is present in a concentration of from about 0.1 to about 1.0 parts per hundred monomers in the internal phase by weight. In some embodiments, the radical inhibitor, retarder or antioxidant is present in a concentration of from about 0.05 to 0.8 parts per hundred monomers in the internal phase by weight. In some embodiments, the radical inhibitor, retarder or antioxidant is present in a concentration of from about 0.3 to about 0.8 phi. In some embodiments, the radical inhibitor, retarder or antioxidant is present in a concentration of from about 0.1 to 0.6 phi.

In some embodiments, the core further comprises a co-initiator, an oxygen scavenger or an auto-oxidizer.

Provided in another aspect is a microcapsule imaging sheet, comprising a first substrate; and a photosensitive microcapsule layer comprising photosensitive microcapsules in contact with a first surface of the first substrate, wherein the photosensitive microcapsules comprise a color-filtering shell, which may further comprise a color-filtering dye or pigment; and a core comprising a leuco dye, a photoinitiator or photosensitizer, and a photohardenable or photosoftenable material.

In some embodiments, the photohardenable material comprises a photopolymerizable or crosslinkable monomer or oligomer. In some embodiments, the polymerizable or crosslinkable monomer or oligomer is selected from a multifunctional acrylate or methacrylate, multifunctional vinyl ether, multifunctional allyl or vinylbenzene, and the oligomer, dendrimer or blend thereof. In some embodiments, the multifunctional acrylate is pentaerythritol triacrylate (PETA-3), pentaerythritol tetra-acrylate (PETA-4), dipentaerythritol hexaacrylate (DPHA), dipentaerythritol pentaacrylate (DPPA), trimethylolpropane triacrylate (TMPTA), 1,6-hexanediol diacrylate (HDDA), tripropylene glycol diacrylate (TPGDA), or neopentyl glycol diacrylate (NPGDA).

In some embodiments, the photosoftenable material comprises a photodegradable or photo-depolymerizable polymer.

In some embodiments, the microcapsule imaging sheet is a full-color imaging sheet comprising photosensitive microcapsules including red-sensitive, green-sensitive, and blue-sensitive microcapsules.

In some embodiments, the photosensitive microcapsule sheet further comprises a developer. In some embodiments, the photosensitive microcapsule sheet further comprises a separate developer layer. In some embodiments, the separate developer layer is overcoated or laminated onto the photosensitive microcapsule layer.

In some embodiments, any one of the microcapsule imaging sheets described herein further comprises a developer layer in contact with: (i) the microcapsule layer; and/or (ii) a developer substrate.

In some embodiments, any one of the microcapsule imaging sheets described herein further comprises an adhesive layer between the developer layer and the microcapsule layer.

In some embodiments, any one of the microcapsule imaging sheets described herein further comprises a primer layer between the microcapsule layer and the first substrate.

In some embodiments, the developer substrate is a polyethylene terephthalate (PET), polyethylene naphthalate (PEN), polycarbonate, polyolefins, cyclic olefin copolymers (COC), cellulose acetates, or a copolymer, blend or composite thereof.

In some embodiments, the developer layer comprises a Lewis acid, an acid clay, or one or more compounds comprising a phenol group or carboxylic acid group, or metal complex thereof. In some embodiments, the developer layer comprises a novolac resin, a salicylic acid derivative, a zincate derivative thereof, or a combination, copolymer, blend, or composite thereof.

In some embodiments, the first substrate is a polyethylene terephthalate (PET), polyethylene naphthalate (PEN), polycarbonate, polyolefins, cyclic olefin copolymers (COC), cellulose acetates, or a copolymer, blend or composite thereof.

In some embodiments, the microcapsule imaging sheet has an increase or improved color gamut and/or fidelity of color reproduction of the original image.

Provided in another aspect is a method of preparing an imaging sheet according to any one of the imaging sheets described herein, the method comprising: (i) coating a first surface of a first substrate with a microcapsule layer to produce a microcapsule-coated first substrate; and (ii) contacting the microcapsule-coated first substrate with a developer layer to produce an imaging sheet.

Provided in another aspect is a method of preparing an imaging sheet according to any one of the imaging sheets described herein, the method comprising (i) coating a first surface of a first substrate with a developer layer to produce a developer-coated first substrate; and (ii) contacting the developer-coated first substrate with a microcapsule layer to produce an imaging sheet.

Provided in another aspect is a method of preparing an imaging sheet according to any one of the imaging sheets described herein, the method comprising coating a first surface of a first substrate with a mixture of developer and photosensitive microcapsules to produce an imaging sheet. In some embodiments, the method further comprises contacting the microcapsule/developer mixture-coated first substrate with a second substrate.

Provided in another aspect is a method of preparing an imaging sheet according to any one of the imaging sheets described herein, the method comprising: (i) coating a first surface of a first substrate with a microcapsule layer to produce a microcapsule-coated first substrate; (ii) coating a second substrate with a developer layer to produce a developer-coated second substrate; and (iii) contacting the developer layer of the developer-coated second substrate with the microcapsule layer of the microcapsule-coated first substrate to produce an imaging sheet.

Provided in another aspect is a method of imaging or printing, the method comprising image-wise exposing an imaging sheet according to any one of the imaging sheets described herein to heat or radiation, wherein the exposing is sufficient to selectively immobilize the leuco dye(s) in the exposed or hardened microcapsules in the microcapsule layer to produce a latent image; and developing the latent image by pressure and/or heat to release the leuco dye(s) to react with the developer and form an image. In some embodiments, the radiation is UV, visible, near IR or IR light.

Provided in another aspect is a method of imaging or printing, the method comprising image-wise exposing an imaging sheet according to any one of the imaging sheets described herein to heat or radiation, wherein the exposing is sufficient to harden or soften the microcapsules in the microcapsule layer to produce a latent image; and developing the latent image by pressure and/or heat to release the leuco dye or dye precursor and form an image. In some embodiments, the radiation is UV, visible, near IR or IR light.

Additional aspects and/or embodiments of the invention will be provided, without limitation, in the detailed description of the present technology set forth below. The following detailed description is exemplary and explanatory, but it is not intended to be limiting.

BRIEF DESCRIPTION OF THE DRAWINGS

Various objects, aspects, features, and advantages of the disclosure will become more apparent and better understood by referring to the detailed description taken in conjunction with the accompanying figures.

FIG. 1A shows the absorption spectra of representative green photoinitiators and yellow color-filtering (blue-absorbing) pigment, Pigment Yellow 155.

FIG. 1B shows the absorption spectra of representative red photoinitiator and magenta/violet color-filtering (blue and green-absorbing) pigment, Pigment Violet 19.

FIG. 2A shows the sheet before development and FIG. 2B shows the sheet after development.

DETAILED DESCRIPTION

Figure 1A:
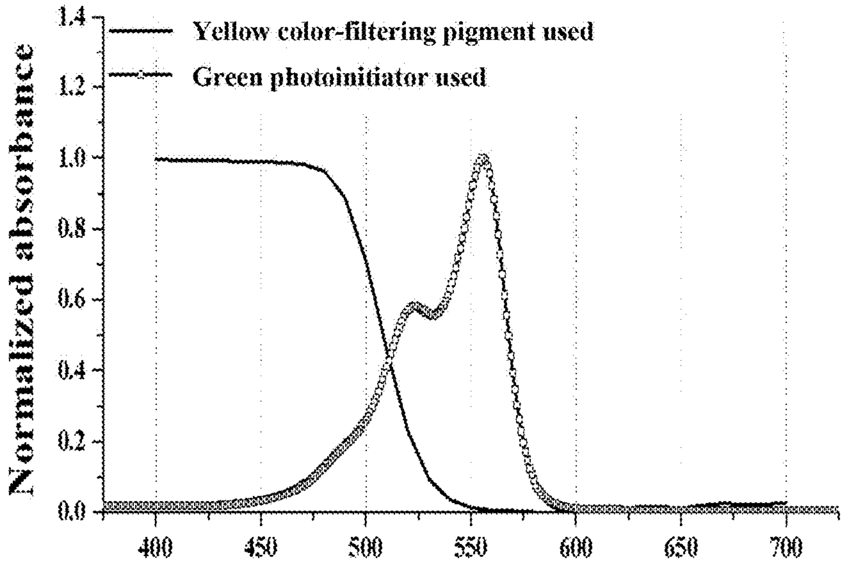
FIGS. 1A and 1B show the absorption spectra of illustrative examples of the color filtering pigment/dye described herein.

In the following description, numerous specific details are set forth in order to provide a thorough understanding of the present technology. Particular exemplary embodiments of the present technology may be implemented without some or all of these specific details. In other instances, certain process operations have not been described in detail but would be understood by the skilled person in the art.

Disclosed herein is improved full-color microcapsule imaging system in which the photosensitive microcapsules comprise a color-filtering shell or a shell capable of filtering off incipient light of undesirable wavelengths.

In some embodiments, the microcapsule imaging system described herein may comprise any or all of the combinations of the microcapsules listed below:

1. A red ($\lambda_1$)-sensitive microcapsule comprising a cyan leuco dye in the photo-hardenable core and a color filtering shell to filter off non-red (non-$\lambda_1$) light such as UV, blue and/or green light.
2. A green ($\lambda_2$)-sensitive microcapsule comprising a magenta leuco dye in the photo-hardenable core and a color filtering shell to filter off non-green (non-$\lambda_2$) light such as UV, blue and/or red light.
3. A blue ($\lambda_3$)-sensitive microcapsule comprising a yellow leuco dye in the photo-hardenable core and a color filtering shell to filter off non-blue (non-$\lambda_3$) light such as UV, green and/or red light.

The red (R), green (G) and blue (B) lights/colors and cyan (C), magenta (M) and yellow (Y) colors mentioned above are given as one of the examples since they are typically used in a complementary-color imaging system. In a false-color imaging system, various light source ($\lambda_1$, $\lambda_2$, and $\lambda_3$) including UV and near IR light may be used as long as they are well separated from one another to ensure a good color separation.

The microcapsules comprising the color-filtering shell described herein greatly reduce undesirable crosstalk among the microcapsules of various color and significantly improve the color fidelity of the image thus reproduced. This is particularly advantageous for digital imaging systems since the microcapsules described herein greatly reduce the need to select light sources of emission wavelengths perfectly matched to the spectrum sensitivities of the photosensitizers/initiators used in the microcapsules. Fine-tuning the emission spectra of the light sources such as LEDs or OLEDs or the absorption spectra of the photosensitizers/initiators while maintaining their quantum efficiency is challenging. The microcapsules described herein provide an effective and low-cost solution to reduce undesirable crosstalk and improve color image fidelity of imaging systems.

The image quality of a photosensitive imaging system is heavily dependent on the spectra sensitivities of the three microcapsules and the emission spectra of the light sources used. As discussed above, there is significant overlap in the absorption spectra of commonly used red (R)- and green (G)- and blue (B)-sensitive photoinitiators, such as cyanine borate photoinitiators as well as overlaps of emission spectra of broad band light sources (e.g., R-, G- and B-OLED used in a OLED display and R-, G-, B-light passing through color filters in LCD displays). For such photoinitiators, there is significant overlap of the absorption spectra of B- and G-photoinitiators in the 440~500 nm range. Similarly, there is also significant overlap of the absorption spectra of G- and R-photoinitiators in the 540~600 nm range. As such, exposing the imaging sheet with a light of wavelength in the overlap range causes crosstalk by hardening more than one types of capsules.

To further illustrate the impact of crosstalk on the image quality, particularly the fidelity of the color reproduction process, a microcapsule imaging sheet comprising three types of microcapsules, each containing one of three (R-sensitive, G-sensitive and B-sensitive) photoinitiators and three complementary cyan (C), magenta (M) and yellow (Y) leuco dyes, respectively, is exposed or written with one of the three light sources (e.g., R-, G-, or B-OLED or LED). In the ideal scenario, after being written by a red (Xi) light, only the R-sensitive microcapsules are hardened and the release of C-leuco dye encapsulated therein is reduced as a function of the red energy received by the red-sensitive microcapsules. The G-sensitive and B-sensitive microcapsules should remain intact and be free of any photoreactions by the R-light exposure. The corresponding M- and Y-leuco dyes enclosed in the G- and B-sensitive microcapsules, respectively, can be released freely to the dye developer layer to reproduce the red image of the source image if the M- and Y-leuco dyes are carefully selected and the ratio of the two dyes is well balanced. Similarly, exposing the imaging sheet with a green ($\lambda_2$) light, only the green image of the source image is reproduced. And, exposing the imaging sheet with a blue $\lambda_3$ light, only the blue image of the source image is reproduced.

The fidelity of the color reproduction process can deteriorate if any crosstalk of the photoreactions occurs, e.g., if more than one type of microcapsules is hardened when the system is written by only one light source. The color of the printed image is then contaminated by unwanted color(s) and the color gamut is significantly deteriorated.

As discussed above, one approach for improving the fidelity of the color reproduction process is to utilize photosensitizers/initiators of a narrow and well-separated spectra sensitivity and light sources of narrow bandwidth and well-separated emission spectra appropriately matched to the spectrum sensitivity of the corresponding photosensitizers/initiators. Such a technique aids in a high-quality color reproduction. However, most photosensitizers/initiators exhibit very broad spectra sensitivities and most readily available modulate-able light sources exhibit either very broad or mismatched emission spectra. There are only few limited choices of commercially available narrow-band LEDs or lasers with reasonably acceptable λmax, size and power efficiency and the cost is often very high for printing applications, particularly for portable printing applications. Also, it is extremely difficult, if not impossible, to find a set of R- and G- and B-photoinitiators with a reasonably narrow band absorption spectrum, aside from cyanine borate photoinitiators. Lastly, such systems require high quantum efficiency of the photosensitizers/initiators and high-power output of light sources that tend to make any high-speed printing application difficult to implement and costly.

Photosensitive Microcapsules

As described herein the photosensitive microcapsules comprise a color-filtering shell, and a core comprising a leuco dye or dye precursor, a photoinitiator or photosensitizer, and a photohardenable or photosoftenable material.

Specifically, in one or more embodiments, the photosensitive microcapsule is sensitive to a specific color or a specific range of radiation spectrum, and the shell comprises one or more of a color-filtering dye or pigment that allow a wavelength corresponding to the color or a range of radiation spectrum to pass through to the core but selectively absorb or filter off all or a portion of the radiation outside of the specific color or range. In some embodiments, the specific color or range is red, green, blue, cyan, magenta or yellow. In some embodiments, the range of radiation spectrum is from about 330 nm to about 900 nm, including about 330 nm, about 350 nm, about 375 nm, about 400 nm, about 425 nm, about 450 nm, about 475 nm, about 500 nm, about 525 nm, about 550 nm, about 575 nm, about 600 nm, about 625 nm, about 650 nm, about 675 nm, about 700 nm, about 725 nm, about 750 nm, about 775 nm, about 800 nm, about 825 nm, about 850 nm, about 875 nm, and 900 nm.

The color-filtering shells may be prepared by adding one or more color-filtering dyes or pigments during the shell formation step(s) of microencapsulation processes. For example, a water soluble or dispersible color-filter dye or pigment may be introduced into the aqueous phase during the pre-wall formation by adsorption or interfacial polymerization/crosslinking and/or coacervation processes to graft or embed the dyes/pigments on or in the pre-wall. Alternatively, the dyes or pigments may be introduced during the second wall formation by in-situ polymerization and/or phase separation processes. A color filtering dye or pigment with a reactive functional group, such as —NH—, $—NH_2$, —OH, —SH, —COOH, —CONH—, $—CONH_2$, —CSNH—, $—CSNH_2$ and the like, to react or graft with the shell formation materials is particularly useful. The unreacted or un-embedded color-filtering dyes or pigments in the aqueous phase were removed by for example, repetitive centrifuging and washing the resultant microcapsules.

Figure 1B:
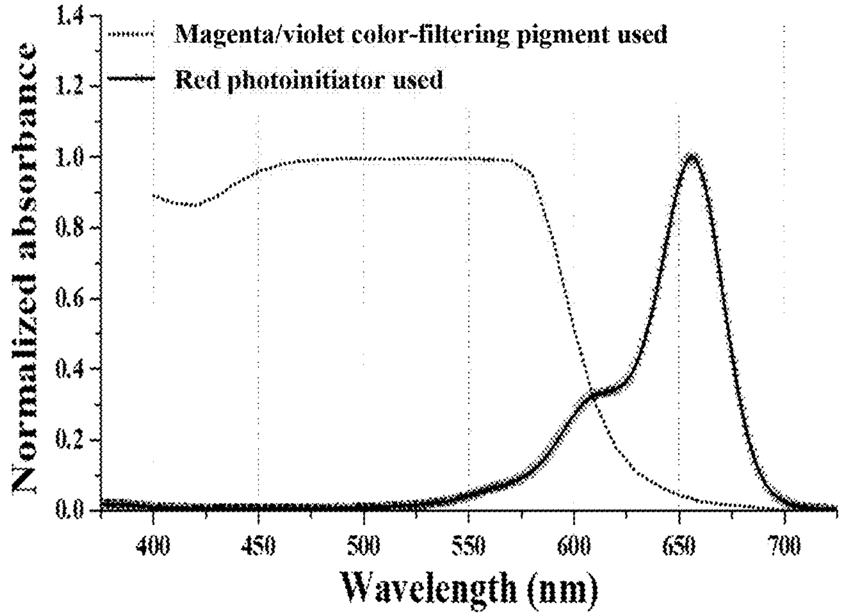

FIGS. 1A and 1B show the spectra of two of the representative water-based color filtering pigment dispersions used in the present invention. As shown in FIG. 1A, the yellow color-filtering pigment very effectively absorbs incipient light of <500 nm and the absorbance drops quickly to zero at about 550 nm. Incorporation of such a yellow pigment into the shell of the green-sensitive microcapsules effectively reduces the risk of unwanted photo-hardening reactions caused by a broad-band blue light source. Depending on the concentration of the yellow pigment present in the shell, the photosensitivity toward green light exposure may be substantially unchanged or slightly reduced as evident from the absorption spectrum of the green photoinitiator used. As shown in FIG. 1B, the incorporation of the magenta/violet pigment into the shell of the red-sensitive microcapsules effectively reduces the risk of unwanted photo-hardening reactions caused by a broad-band green and/or blue light source.

The color filtering shell described herein filters off part of or all of the light of unwanted wavelengths but allows the light of the right wavelength to pass through and trigger the photoreactions in the core. For example, a green-sensitive microcapsule comprising a magenta leuco dye, a green sensitive photoinitiator and a shell comprising a yellow dye or pigment as the color filtering material will screen off the unwanted blue light (the complementary light of yellow color) in the shell and allow green light to pass through and harden the core. Similarly, by replacing the yellow dye or pigment in the shell by a cyan dye or pigment, the unwanted red light (the complementary light of cyan color) is screened off. And, if both yellow and cyan dyes/pigments are used in the shell of the green-sensitive microcapsule, both the unwanted blue and red light are screened off.

As such, the color-filtering dyes/pigments in the shell protects the core from being hardened by a wrong light source even if the photosensitizer/initiator in the core may be somewhat sensitive to the wrong light. As demonstrated in the Examples, this resulted in a significant reduction of undesirable crosstalk and greatly improved the color fidelity of the color printing process. Moreover, the color of the color-filtering dyes or pigments are hardly seen after the imaging sheet is developed by, for example, pressure and/or heat, since they are immobilized by the network of the shell, and their color(s) are effectively hidden underneath the printed images in the developer layer (see FIGS. 2A and 2B).

Figures 2A, 2B:
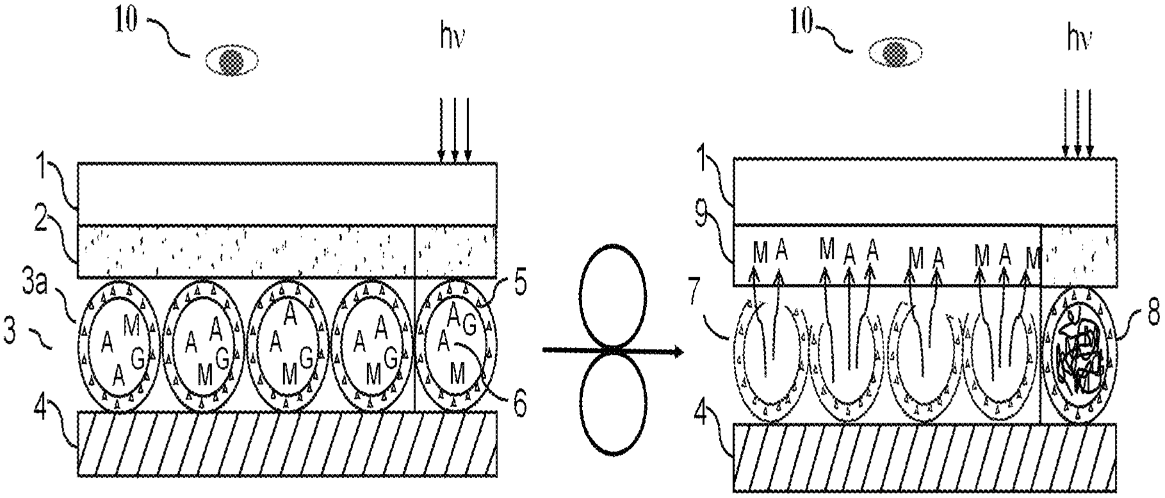
FIGS. 2A and 2B are schematic illustrations of an imaging sheet comprising green-sensitive microcapsules comprising a color-filtering sheet.

FIGS. 2A and 2B are schematic illustrations of an imaging sheet comprising green-sensitive microcapsules comprising a color-filtering shell. FIG. 2A shows the sheet before development and FIG. 2B shows the sheet after exposure and development. In FIGS. 2A-2B, depicted are a transparent substrate 1, a developer layer 2, a microcapsule layer 3 with photosensitive microcapsules 3*a*, an opaque substrate 4, a photosensitive microcapsule shell 5 including a color-filtering yellow and/or cyan dye or pigment (depicted by the triangular-shaped elements), a core 6 including a green sensitive photoinitiator G, acrylic monomer A, and magenta leuco dye M, ruptured microcapsules 7, a hardened capsule 8 with the magenta leuco dye immobilized in the capsule, a developer layer 9 with the magenta leuco dye M and acrylic monomer A transferred or diffused from ruptured microcapsules 7, and a viewer 10. In some embodiments, a microencapsulated imaging sheet according to the present disclosure includes a photosensitive microcapsule layer 3 comprising photosensitive microcapsules 3*a* on a substrate 4. The photosensitive microcapsule 3*a* comprises a shell 5 comprising a color-filtering dye or pigment Δ (e.g. yellow and/or cyan dye/pigment dye) and a hardenable core 6 which comprises (i) a dye (e.g., a leuco dye, such as magenta leuco dye), which imparts color to the microencapsulated imaging sheet upon release and development under pressure and/or heat, (ii) a photoinitiator such as a green-sensitive cyanine borate and (iii) a multifunctional monomer such as trimethylolpropane triacrylate (TMPTA). The developer, for example, may be present in a developing layer 9 which is configured to be separately placed into contact with the microcapsule layer 3. Alternatively, the developer may be premixed with the microcapsule and coated as a single layer on the substrate 4. In some embodiments, the microcapsule layer may be brought to contact with the developer layer and developed therewith after the image-wise exposure step. The developed microcapsule layer may be discarded after the image is transferred and developed to the developer layer (the two-sheet imaging system).

Upon image-wise exposure, the microcapsules are selectively hardened or softened. The dye (e.g., a leuco dye)

enclosed in the microcapsules are selectively released from the ruptured microcapsule 7 in the pressure/heat development step, and undergoes a chemical transformation, transitioning from a colorless state to a color state (e.g., magenta, cyan, or yellow).

In some embodiments, the one or more of color-filtering dye or pigment comprises a functional group to react with one or more shell-forming materials. In some embodiments, the functional group is selected from a group comprising —OH, —SH, $—NH_2$, —N—HR, $—CH_2OH$, $—CH_2OR$, —CHO, $—CONH_2$, —CONHR, urea, thiourea, isocyanate, thioisocyanate, epoxide, and their precursors, wherein R is alkyl, aryl, arylalkyl, alkylaryl or their heteroatom derivatives, particularly those with a short chain length. In some embodiments, the functional group is selected from a group comprising —OH, —SH, $—NH_2$, —N—HR, $—CONH_2$, —NCO, —NCS—, $—CH_2OH$, $—CH_2OR$, —CHO, and their precursors, wherein R is alkyl, aryl, arylalkyl, alkylaryl or their heteroatom derivatives, particularly those with a short chain length. In some embodiments, the color-filtering dye or pigment comprising the functional group is water soluble or dispersible and is included in the aqueous phase (the external phase) and incorporated into or onto the shell of the microcapsules by adsorption or interfacial reactions.

In some embodiments, the one or more shell-forming materials are included in the internal phase or oil phase and form a shell by interfacial polymerization or crosslinking during the microencapsulation process. In some embodiments, the one or more shell-forming materials are included in the internal phase and/or external phase and form a shell by interfacial polymerization or crosslinking during the microencapsulation process. In some embodiments, the one or more shell-forming materials included in the oil or internal phases are selected from a group comprising multifunctional isocyanate, thioisocyanate, and epoxide, or their precursors.

In some embodiments, the one or more shell-forming materials are included in the external phase or aqueous phase and form a shell by interfacial or in-situ polymerization or crosslinking, phase separation, or coacervation during the microencapsulation process. In some embodiments, the one or more shell-forming materials in the external phase or aqueous phase are water-soluble compounds comprising reactive functional groups including but are not limited to, —OH, —SH, $—NH_2$, —N—HR, —COOH, $—CH_2OR$, —CHO or their precursors, wherein R is alkyl, aryl, arylalkyl, alkylaryl or their heteroatom derivatives, particularly those with a short chain length. In some embodiments, the one or more shell-forming materials are selected from a group comprising urea, amine, urea formaldehyde, melamine formaldehyde, poly(N-methylol acrylamide), gelatin, gum arabic, pectin, carboxylate methyl cellulose and their oligomers, copolymers or blends thereof.

In some embodiments, the photoinitiator or photosensitizer is red-sensitive and the color of the color filtering shell is magenta, yellow or their combinations. In some embodiments, the photoinitiator or photosensitizer is green-sensitive and the color of the color-filtering shell is cyan, yellow, or any combination thereof. In some embodiments, the photoinitiator or photosensitizer is blue-sensitive and the color of the color-filtering shell is magenta, cyan, or any combination thereof. In some embodiments, the photoinitiator or photosensitizer is IR-sensitive and the color of the color-filtering shell is cyan, magenta, yellow or any combination thereof.

In some embodiments, the color-filtering shell comprises one or more of a color-filtering dye or pigment. In some embodiments, the color-filtering dye is thermo- or photobleachable. For blue sensitive microcapsules, the color-filtering dye or pigment may be a magenta (green-absorbing) and/or cyan (red-absorbing) dye or pigment. For the green-sensitive microcapsules, the color-filtering dye or pigment is a yellow (blue-absorbing) and/or cyan (red-absorbing) dye or pigment. In some embodiments, color-filtering dye or pigment is Yellow Pigment 155 or CI Direct Yellow 86. For red-sensitive microcapsules, the color-filtering dye or pigment is a yellow (blue-absorbing) and/or magenta (green-absorbing) dye or pigment for the red-sensitive microcapsules. In some embodiments, the color-filtering dye or pigment is Pigment Violet 19 or CI Dispersed Red 60.

Illustrative examples of suitable color-filtering dye or pigments include, but are not limited to, cyanine or semi-cyanine dyes, quinacridone dyes, perelene dyes. Cyan, magenta and yellow dyes or pigments used in inkjet printing are particularly suitable. They are readily available from suppliers such as Cabot, Kolorjet Chemicals, Sun Chemicals, and Kao Collins, Inc. Reviews of inkjet printing dyes/pigments include P. Gregory, "High-Technology Applications of Organic Colorants", Plenum Press, New York, 1991; P. Gregory, "Colorants For Electronic Printers," in J.A.G. Drake Ed., "Chemical Technology In Printing And Imaging Systems", Royal Soc. Chem. (1993); W. Bauer, J. Ritter, "Tailoring Dyes for Ink Jet Applications", American Ink Maker 73, 42-49 (1995); R. W. Kenyon, "Dyes for Ink Jet Printing, Innovations in Modern Color Chemistry", SCI, London, 1994; W. Bauer, B. Baumgart and W. Zoller, "Magenta Dyes for Inkjet Applications" in "Recent Progress in Ink Jet Technologies II" Chapter 6, IS&T, 1999; R. Senthilkumar, "Dyes for Ink Jet Printing of Textiles" (2016) and D. M. Marmion, "Handbook of US Colorants For Foods, Drugs And Cosmetics" John Wiley & Sons (1984).

In some embodiments, the one or more of a color-filtering dye or pigment present in the microcapsule is in amount of from about 0.01 to about 3 phi (parts per hundred internal phase or parts per hundred core by weight), including about 0.01, about 0.02, about 0.03, about 0.04, about 0.05, about 0.06, about 0.07, about 0.08, about 0.09, about 0.10, about 0.20, about 0.30, about 0.40, about 0.50, about 0.60, about 0.70, about 0.80, about 0.90, about 1.0, about 1.5, about 2.0, about 2.5, and about 3.0 parts per hundred core. In some embodiments, the one or more of a color-filtering dye or pigment present in the microcapsule is in amount of from about 0.05 to about 1.0 phi.

In some embodiments, when the photosensitive microcapsules are green-sensitive or red-sensitive microcapsules and the one or more color-filtering dye or pigment comprises a yellow (blue-absorbing) color-filtering dye or pigment, the total absorption optical density of the one or more yellow (blue-absorbing) color-filtering dye/pigment in the about 450 nm to about 500 nm range is from about 0.005 to about 0.3. In some embodiments, the total optical density of the one or more yellow (blue-absorbing) color-filtering dye/pigment in the about 450 nm to about 500 nm range is from about 0.05 to about 0.2.

In some embodiments, when the photosensitive microcapsules are green-sensitive and the one or more color-filtering dye or pigment comprises a cyan (red-absorbing) color-filtering dye or pigment, the total absorption optical density of the one or more cyan (red-absorbing) color-filtering dye/pigment in the about 600 nm to about 650 nm range is from about 0.005 to about 0.3. In some embodiments, the total optical density of the one or more cyan (red-absorbing) color-filtering dye/pigment in the about 600 nm to about 650 nm range is from about 0.05 to about 0.2.

In some embodiments, when the photosensitive microcapsules are blue-sensitive or red-sensitive microcapsules and the one or more color-filtering dye or pigment comprises a magenta (green-absorbing) color-filtering dye or pigment, the total absorption optical density of the one or more magenta (green-absorbing) color-filtering dye or pigment in the about 500 nm to about 600 nm range is from about 0.005 to about 0.3. In some embodiments, the total optical density of the one or more magenta (green-absorbing) color-filtering dye or pigment in the about 500 nm to about 600 nm range is from about 0.05 to about 0.2.

It is worth noting that the red (R), green (G) and blue (B) lights/colors and cyan (C), magenta (M) and yellow (Y) colors mentioned above are given as non-limiting examples since they are typically used in a complementary-color imaging system. In a false-color imaging system, various light sources ($\lambda_1$, $\lambda_2$, and $\lambda_3$) including UV and near IR lights may be used as long as they are well separated from one another to ensure good color separation.

In some embodiments, the photosensitive microcapsule has an average diameter or $D_{50}$ from about 4.0 μm to about 9.0 μm, including about 4.0, about 4.5, about 5.0, about 5.5, about 6.0, about 6.5, about 7.0, about 7.5, about 8.0, about 8.5, and about 9.0 μm. In some embodiments, the photosensitive microcapsule has an average diameter or $D_{50}$ from about 5.0 μm to about 6.5 μm.

Further, the inventors of the present disclosure discovered that incorporating a color-filtering dye/pigment in the core of the microcapsules resulted in a contaminated color. Without wishing to be bound by theory, it is believed that a soluble or dispersed dye/pigment in the core was released at the same time as the leuco dye(s) and monomer(s) upon pressure/heat development to the developer layer, and its color would be seen by the viewer unless the color-filtering dye/pigment can be bleached effectively after the development. In fact, the presence of a color-filtering dye or pigment in the core may also undesirably broaden the spectrum sensitivity of the microcapsules and cause crosstalk of the microcapsule imaging system particularly if the color-filtering dye or pigment itself also exhibits some degree of photosensitivity in the unwanted wavelength range via for example, an energy or electron transfer mechanism. In some embodiments, the core does not comprise (that is, lacks) any color-filtering dye or pigment.

As described herein the photosensitive microcapsules comprise a color-filtering shell; and a core comprising a leuco dye, a photoinitiator or photosensitizer, and a photohardenable or photosoftenable material.

Enclosed by the color-filtering shell or shells, each photosensitive microcapsule comprises a core comprising a leuco dye, a photoinitiator or photosensitizer, and a photohardenable or photosoftenable material. In some embodiments, the leuco dye is a cyan, magenta, yellow, black leuco dye, or any combination thereof. By way of non-limiting example, a representative magenta leuco dye may include PERGASCRIPT® Red I6B (CAS: 50292-95-0, Synamedia-chem); COPIKEM 35 (CAS: 50292-91-6), Blue I-2G and Blue-63 from BASF, Blue 220, Blue 203, Red 500, Red 40 or Black 305 from Yamada, JYDY-1, JYDR-2, JYDR-3, JYDB-1, or JYDB-2 from WuXi Jiayida New Materials, Red-16, O-C6, or O-C8 from Synmedia Chemicals, or ODB-2 from Anyang General Chemicals. Additional suitable examples of leuco dyes are disclosed in, e.g., CHEMISTRY AND APPLICATIONS OF LEUCO DYES (R. Muthyala ed., 1997).

Suitable photoinitiators or photosensitizers include borate complexes which may be represented by the general structure:

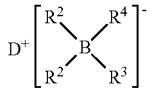

wherein $D^+$ is a cationic chromophore, such as a cyanine, semicyanine, squaraine (e.g., squarylium), thiopyrylium, or triarylmethane. In some embodiments, $R^1$, $R^2$, $R^3$, and $R^4$ are each independently a substituted or unsubstituted alkyl, arylalkyl, or aryl group. In some embodiments, $R^1$ is an alkyl or arylalkyl group, and $R^2$, $R^3$, and $R^4$ are aryl groups. In some embodiments, the one or more photoinitiators comprise one or more of ketocoumarins, benzylidene ketones, benzophenones, thioxanthones, acrylphosphine oxides, metallocene derivatives and other Norrish Type I, II and III photoinitiators, and combinations thereof.

The photoinitiator may be a red-sensitive, green-sensitive, or blue-sensitive cyanine borate, semi-cyanine borate, or ketocoumarin. In some embodiments, the photoinitiator is a borate of cyanine, semi-cyanine borate, triarylmethane, squarylium or thiopyrylium dye. In some embodiments, photoinitiator or photosensitizer comprises a UV-sensitive, blue-sensitive, green-sensitive, red-sensitive, or near-IR-sensitive photoinitiator or sensitizer.

The photohardenable material may comprise a photopolymerizable or crosslinkable monomer or oligomer. In some embodiments, the polymerizable or crosslinkable monomer or oligomer is selected from a multifunctional acrylate or methacrylate, multifunctional vinyl ether, multifunctional allyl or vinylbenzene, and the oligomer, dendrimer or blend thereof. The multifunctional acrylate may be pentaerythritol triacrylate (PETA-3), pentaerythritol tetra-acrylate (PETA-4), dipentaerythritol hexaacrylate (DPHA), dipentaerythritol pentaacrylate (DPPA), trimethylolpropane triacrylate (TMPTA), 1,6-hexanediol diacrylate (HDDA), tripropylene glycol diacrylate (TPGDA), or neopentyl glycol diacrylate (NPGDA). The photosoftenable material may comprise a photodegradable or photo-depolymerizable polymer.

In some embodiments, the core further comprises a radical inhibitor, retarder, or antioxidant. In some instances, a retarder or radical inhibitor is used to slow down the photospeed of a particular type of the R-, G- or B-photosensitive microcapsules to reduce even further the degree of crosstalk of the microcapsules with a color-filtering shell.

The radical inhibitor, antioxidant, or retarder may be selected from a group comprising phenols, anilines, N-oxide of hindered amines, CuO, copper dithiocarbamate, copper or manganese carboxylates, and thiuram (thiocarbanoyl) derivatives, or combinations thereof, such as

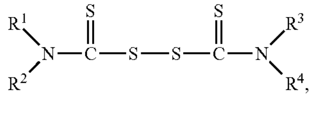

wherein $R^1$, $R^2$, $R^3$, and $R^4$ is independently an alkyl group having the carbon number of 1 to 8 or a phenyl group.

The radical inhibitor may be a phenol radical inhibitor selected from a list comprising alkyl gallate, butyl hydroxy anisole, 3,5-di-t-butylbutyl-4-hydroxytoluene, Vitamin E, 3,4-dihydro-2,5,7,8-tetramethyl-2-(4,8,12-trimethyltridecyl)-2H-1-benzopyran-6-ol (IRGANOX® E201), triethylene glycol bis(3-tert-butyl-4-hydroxy-5-methylphenyl) propionate (IRGANOX® 245), 3-{[3-(3,5-di-tert-butyl-4-hydroxyphenyl)propanoyl]oxy}-2,2-bis({[3-(3,5-di-tert-butyl-4hydroxyphenyl)propanoyl]-oxy}methyl)-propyl 3-(3,5-di-tert-butyl-4-hydroxyphenyl)propanoate (IRGANOX® 1010), 1,2-Bis(3,5-di-tert-butyl-4-hydroxyhvdrocinnamoyl)hydrazine (IRGANOX® MD 1024, 1,3,5-trimethyl-2,4,6-tris(3,5-di-tert-butyl-4-hydroxybenzyl)benzene (IRGANOX® 1076), 2,2'-Thiobis(6-tert-butyl-p-cresol) (IRGANOX® 1081), N,N'-hexane-1,6-diylbis(3-3,5-di-tert-butyl-4-hydroxyphenyl-propionamide) (IRGANOX® 1098), 3,5-bis(1,1-dimethylethyl)-4-hydroxybenzenepropanoic acid thiodi-2,1-ethanediyl ester (IRGANOX® 1035), benzenepropanoic acid, 3,5-bis(1,1-dimethyl-ethyl)-4-hydroxy-C7-C9 branched alkyl esters (IRGANOX® 1135), 3,3',3',5,5',5'-hexa-tert-butyl-a,a',a'-(mesitylene-2,4,6-triyl)tri-p-cresol (IRGANOX® 1330), (1,1-di-tert-butyl)-4-hydroxyphenyl)methyl)ethylphosphonate) (IRGANOX® 1425), 1,3,5-tris[4-hydroxy-3,5-bis(2-methyl-2-propanyl)benzyl]-1,3,5-triazinane-2,4,6-trione (IRGANOX® 3114), 2,6-di-tert-butyl-4-(4,6-bis(octylthio)-1,3,5-triazin-2-ylamino) phenol (IRGANOX® 565), and other IRGANOX® primary antioxidants.

The radical inhibitor may be a N-oxide of hindered amine, wherein the hindered amine is selected from the list comprising bis(2,2,6,6-tetramethyl-4-piperidyl)sebaceate (Tinuvin 770 DF), bis(1,2,2,6,6pentamethyl-4-piperidyl) sebacate (ADK STAB LA-72), tetrakis(2,2,6,6-tetramethyl-4-piperidyl) butane-1,2,3, Atetracarboxylate (ADK STAB LA-57), and bis(1-undecanoxy-2,2,6,6-tetramethylpiperidin-4-yl)carbonate (ADK STAB LA-81).

The radical inhibitor, retarder or antioxidant may be present in a concentration of from about 0.01 to about 1 part per hundred core by weight, including about 0.01, about 0.05, about 0.10, about 0.2, about 0.3, about 0.4, about 0.5 4, about 0.6, about 0.7, about 0.8, about 0.9, and about 1.0 per hundred monomers in the internal phase by weight. In some embodiments, the radical inhibitor, retarder or antioxidant is present in a concentration of from about 0.3 to 0.5 part per hundred monomers in the internal phase by weight.

In some embodiments, the radical inhibitor, retarder or antioxidant is present in a concentration of from about 0.1 to about 1.0 parts per hundred monomers in the internal phase by weight. In some embodiments, the radical inhibitor, retarder or antioxidant is present in a concentration of from about 0.05 to 0.8 parts per hundred monomers in the internal phase by weight. In some embodiments, the radical inhibitor, retarder or antioxidant is present in a concentration of from about 0.3 to about 0.8 phi. In some embodiments, the radical inhibitor, retarder or antioxidant is present in a concentration of from about 0.1 to 0.6 phi.

The core may further comprise one or more of a co-initiator, an oxygen scavenger or an auto-oxidizer, alone or in any combination. For instance, a co-initiator, oxygen scavenger or auto-oxidizer may be used to accelerate the photospeed of a particular type of the R-, G- or B-photosensitive microcapsules to further reduce the degree of crosstalk of the microcapsules with a color-filtering shell.

Microcapsule Imaging Sheet

Also described herein is a microcapsule imaging sheet, comprising: a first substrate; and a photosensitive microcapsule layer comprising photosensitive microcapsules in contact with a first surface of the first substrate, wherein the photosensitive microcapsules comprise a color-filtering shell and a core comprising a leuco dye, a photoinitiator or photosensitizer, and a photohardenable or photosoftenable material.

The photosensitive microcapsule layer may comprise one or more types of microcapsules. For instance, the microcapsules may be sensitive to red visible light, green visible light, or blue visible light. The photosensitive microcapsule layer may comprise red-sensitive, green-sensitive, or blue-sensitive microcapsules, in which case the microencapsulated imaging sheet is considered a "full-color" imaging sheet.

In some embodiments, the photosensitive microcapsule layer or sheet further comprises a developer. In some embodiments, the photosensitive microcapsule layer or sheet further comprises a separate developer layer. In some embodiments, the separate developer layer is overcoated or laminated onto the photosensitive microcapsule layer.

In some embodiments, any one of the microcapsule imaging sheet described herein further comprises an adhesive layer between the developer layer and the microcapsule layer.

In some embodiments, any one of the microcapsule imaging sheet described herein further comprises a primer layer between the microcapsule layer and the first substrate.

The microcapsule imaging sheets described herein have an increase or improved color gamut and/or fidelity of color reproduction of the original image.

Substrates

The microcapsules described herein may be coated onto a substrate (e.g., a first or second substrate). The substrate may be any suitable material with sufficient thickness, flexibility, reflectivity (e.g., hiding power), and durability to record printed media (e.g., images). In some embodiments, the substrate is white or transparent. The substrate may be a polyethylene terephthalate (PET), polyethylene naphthalate (PEN), polycarbonate, polyolefins, cyclic olefin copolymers (COC), cellulose acetates, or a copolymer, blend or composite thereof. For example, a commercially available PET substrate is MELINEX® 339 made by Dupont Teijin Films ("PET339"). Other useful commercially-available PET films include, but not limited to, HOSTAPHAN® polyester films (Mitsubishi Polyester Film), MELINEX® (DuPont Teijin Films™), and MYLAR® polyester films (DuPont Teijin Films™). The substrate may be in contact with the microcapsule layer, the developer layer, or both.

The substrate may have any suitable thickness. In some embodiments, the substrate has a thickness of about 10 μm, about 20 μm, about 30 μm, about 40 μm, about 50 μm, about 60 μm, about 70 μm, about 80 μm, about 90 μm, about 100 μm, about 150 μm, about 200 μm, about 250 μm, about 300 μm, about 350 μm, about 400 μm, about 450 μm, about 500 μm, or any range or value therein between.

Developer Layer

In some embodiments, imaging sheets according to the present disclosure include a developer layer that is contact with the microcapsule layer and/or the developer substrate. The developer layer may be placed in contact with the microcapsule layer by for example, lamination after being applied to the second substrate. In some embodiments, the developer layer may be over-coated onto the microcapsule layer and the resultant over-coated sheet is used as is without the second substrate. In some embodiments, the over-coated developer/microcapsule sheet may be further over-coated with a durable protective coating or laminated with a second substrate. In some embodiments, the composition of the developer layer may be pre-mixed with the composition of the microcapsule layer and coated as a single layer onto the first substrate.

In some embodiments, imaging systems according to the present disclosure comprise two separate sheets, a photosensitive microcapsule sheet and a developer sheet. The microcapsule sheet is image-wise exposed, brought to contact with the developer sheet, and subsequently developed with pressure/heat. The microcapsule sheet is discarded after the leuco dyes are transferred to the developer sheet.

In some embodiments, the developer substrate is a polyethylene terephthalate (PET), polyethylene naphthalate (PEN), polycarbonate, polyolefins, cyclic olefin copolymers (COC), cellulose acetates, or a copolymer, blend or composite thereof.

In some embodiments, the developer layer comprises one or more leuco dye developers. By way of non-limiting example, the developers may comprise Lewis acids, silicic acids, salicylic acid derivatives, benzoic acid derivatives, novolac resins, and their metal complexes, particularly zinc complexes, or blends, composites, copolymers including graft and block copolymers, or combinations thereof. For instance, the developer(s) may comprise: acid clay, zinc 3,5-bis(alpha-methylbenzyl)salicylate (e.g., N-054-W, SANKO Co., Ltd.), zinc 3,5-di-t-butyl salicylate, zinc 3,5-dioctyl salicylate, HRJ 4542 (Schenectady Chemical), or novolac resin developers such as RD9870, RD9870A, RD9880, RD9880U, RF-118, etc. (Xinxiang Richful Lube Additive Co., Ltd.). In some embodiments, the developer layer comprises a Lewis acid, an acid clay, or one or more compounds comprising a phenol group or carboxylic acid group, or metal complex thereof. In some embodiments, developer layer comprises a novolac resin, a salicylic acid derivative, a zincate derivative thereof, or a combination, copolymer, blend, or composite thereof.

The developer layer may have any suitable thickness. For instance, the developer layer may have a thickness of at least about 1 μm, at least about 2 μm, at least about 3 μm, at least about 4 μm, at least about 5 μm, at least about 6 μm, at least about 7 μm, at least about 8 μm, at least about 9 μm, at least about 10 μm, at least about 15 μm, at least about 20 μm, at least about 25 μm, at least about 30 μm, at least about 35 μm, at least about 40 μm, at least about 45 μm, at least about 50 μm, or any range or value therein. In some embodiments, the developer layer has a thickness from about 1 μm to about 30 μm, about 2 μm to about 20 μm, or about 3 μm to about 15 μm.

The developer may be present in the developer layer at a concentration by weight, relative to the dry weight of the developer layer, of greater than or equal to about 50 wt. %, greater than or equal to about 55 wt. %, greater than or equal to about 60 wt. %, greater than or equal to about 65 wt. %, greater than or equal to about 70 wt. %, greater than or equal to about 75 wt. %, greater than or equal to about 80 wt. %, greater than or equal to about 85 wt. %, greater than or equal to about 90 wt. %, greater than or equal to about 95 wt. %, greater than or equal to about 96 wt. %, greater than or equal to about 97 wt. %, greater than or equal to about 98 wt. %, greater than or equal to about 99 wt. %, or any range or value therein between. In some embodiments, the developer layer may comprise a polymeric binder and a filler such as silica, acid clay, $CaSO_4$, $BaSO_4$, and $TiO_2$.

Methods

Provided in another aspect is a method of preparing an imaging sheet according to any one of the imaging sheets described herein, the method comprising: (i) coating a first surface of a first substrate with a microcapsule layer to produce a microcapsule-coated first substrate; and (ii) contacting the microcapsule-coated first substrate with a developer layer to produce an imaging sheet.

Provided in another aspect is a method of preparing an imaging sheet according to any one of the imaging sheets described herein, the method comprising: (i) coating a first surface of a first substrate with a developer layer to produce a developer-coated first substrate; and (ii) contacting the developer-coated first substrate with a microcapsule layer to produce an imaging sheet.

Provided in another aspect is a method of preparing an imaging sheet according to any one of the imaging sheets described herein, the method comprising coating a first surface of a first substrate with a mixture of developer and photosensitive microcapsules to produce an imaging sheet. In some embodiments, the method further comprises contacting the microcapsule/developer mixture-coated first substrate with a second substrate. In some embodiments, the method further comprises contacting the microcapsule/developer mixture-coated first substrate with a protective overcoat.

Provided in another aspect is a method of preparing an imaging sheet according to any one of the imaging sheets described herein, the method comprising: (i) coating a first surface of a first substrate with a microcapsule layer to produce a microcapsule-coated first substrate; (ii) coating a second substrate with a developer layer to produce a developer-coated second substrate; and (iii) contacting the developer layer of the developer-coated second substrate with the microcapsule layer of the microcapsule-coated first substrate to produce an imaging sheet.

Provided in another aspect is a method imaging or printing, the method comprising image-wise exposing an imaging sheet according to any one of the imaging sheets described herein to heat or radiation, wherein the exposing is sufficient to selectively immobilize or mobilize the leuco dyes in the microcapsules by hardening or softening the microcapsules to produce an latent image; and developing the latent image by pressure and/or heat to form an image. In some embodiments, the exposing radiation is UV, visible, near IR or IR light. In some embodiments, the exposing radiation is UV, visible, near IR or IR light. In some embodiments, the exposing or development heat is from a thermal print head.

In some embodiments, a process of making a photosensitive microcapsule is provided. Exemplary embodiments for making photosensitive microcapsules are provided in the Examples. The process includes providing an aqueous phase, contacting the aqueous phase with an internal phase comprising a leuco dye or dye precursor, a photoinitiator or photosensitizer, and a photohardenable or photosoftenable material to provide a mixture, contacting the mixture with a dispersion comprising a color-filtering dye or pigment, and forming a photosensitive microcapsule by interfacial or in-situ polymerization or crosslinking, phase separation, or coacervation during the microencapsulation process.

While the foregoing terms are believed to be well understood by one of ordinary skill in the art, the following definitions are set forth to facilitate explanation of the presently disclosed subject matter.

The term “a” or “an” may refer to one or more of that entity, i.e. can refer to plural referents. As such, the terms “a” or “an”, “one or more” and “at least one” are used interchangeably herein. In addition, reference to “an element” by the indefinite article “a” or “an” does not exclude the possibility that more than one of the elements is present, unless the context clearly requires that there is one and only one of the elements.

Reference throughout this specification to "one embodiment", "an embodiment", "one aspect", or "an aspect" means that a particular feature, structure or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

As used herein, the terms "about" or "approximately" when preceding a numerical value indicates the value plus or minus a range of 10% of the value.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the present application and relevant art and should not be interpreted in an idealized or overly formal sense unless expressly so defined herein. While not explicitly defined below, such terms should be interpreted according to their common meaning.

For purposes of the present disclosure, the term "color density" refers to a dye's ability to absorb light, where the greater the dye's light absorption, the higher the color density (i.e., the more intense the color). The lower the dye's light absorption, the lower the color density (i.e., the less intense the color).

For purposes of this disclosure, the term "maximum color density" (or "$D_{max}$") refers to the maximum color density achieved by a dye after a given development time (e.g., after about 1 hr, about 2 hrs., about 4 hrs., about 8 hrs., about 12 hrs., about 24 hrs., etc.).

For purposes of this disclosure, the term "fresh color density" or "fresh $D_{max}$" refers to the color density achieved by a dye immediately (e.g., within one second or a few seconds to several minutes, e.g., between about 1 second, about 2 seconds, about 5 seconds, or about ten seconds to about 1 minute, about 2 minutes, about 3 minutes, about 4 minutes, or about 5 minutes) upon microcapsule rupture (e.g., at the onset of color development).

For purposes of this disclosure, the term "leuco dye" refers to a chemical dye which can alternate between two chemical forms, one of which is colorless. The transformation from colorless to color form may be reversible or irreversible and may be induced by changes in temperature, pH, irradiation, and/or redox state.

Unless explicitly indicated otherwise, all specified embodiments, features, and terms intend to include both the recited embodiment, feature, or term and equivalents thereof.

Reference will now be made in detail to specific embodiments contemplated by the present disclosure. While various embodiments are described herein, it will be understood that the disclosure is not intended to limit the present technology to the described embodiments. On the contrary, the present disclosure is intended to cover alternatives, modifications, and equivalents as may be included within the spirit and scope of the technology as defined by the appended claims.

EXAMPLES

Example 1. Preparation of Control Red-, Green- and Blue-Sensitive Microcapsules and Self-Containing Imaging Sheets Based on the Microcapsules Table 1 below lists the materials used in the following Examples.

TABLE 1

| Materials used in Example 1 | |
|---|---|
| Chemical Name | Description |
| Versa TL502 | Sulfonated polystyrene from Nouryon Corp. |
| CYMEL ® 385 | Methylated high imino melamine resin with a low degree of alkylation from Allnex Corp. |
| NW-YOT05 | Yellow (Pigment Yellow 155) water-based ink dispersion (D50 of 0.14 um) from Taiwan Nanotechnology Corporation. |
| NW-MEA12 | Magenta (Pigment Violet 19) water-based ink dispersion (D50 of 0.14 um) from Taiwan Nanotechnology Corporation. |
| DESMODUR ® N 100 | Aliphatic polyisocyanate from Covestro Corp. |
| AEROSOL ™ OT | Sodium bis (2-ethylhexyl) sulfosuccinate surfactant from Cytec Corp. |
| TRITON ™ X-114 | Nonionic surfactant from Dow Corp. |
| IRGANOX ® 1035 | Phenolic antioxidant and heat stabilizer from BASF |
| GSB1202 | Spacer particle from Guidewin Corp. ($D_{50}$ = 11.44 □m) |
| CELLOSIZE ™ QP-52000H | Hydroxyethyl cellulose from Dow Corp. |
| SIL WET ® L-7001 | Silicone surfactant from Momentive Performance Materials |
| SIL WET ® L-7604 | Silicone surfactant from Momentive Performance Materials |
| JONCRYL ® 7256 | Latex binder from BASF |
| TAMOL ™ 731 DP | A hydrophobic copolymer dispersant from Dow Corp. |
| PVA1799 | Polyvinyl alcohol from Sinochem Corp. |

TABLE 1-continued

| Materials used in Example 1 | |
|---|---|
| Chemical Name | Description |
| CAB-O-SPERSE ® 1015A | An aqueous dispersion of CAB-O-SIL ® L-90 (fumed silica) from Cabot Corp. |
| Eastman AQ ™ 55S | Water-dispersible polyester resin from Eastman |

Preparation of Photosensitive Microcapsules

Photosensitive microcapsules were prepared using materials in Table 2, according to the following procedure:

1. Into a beaker, 220 parts of water and 8 parts of Versa TL502 sulfonated polystyrene (dry) were added and thoroughly mixed.
2. 10 parts of pectin (polygalacturonic acid methyl ester) was slowly sifted into the mixture and stirred overnight at room temperature (500~1000 rpm).
3. The pH was adjusted to 7.5 with 10% sodium carbonate, and the mixing speed was increased to 1750 rpm.
4. The internal phase as shown in Table 2 was added over a period of 15-30 seconds. The resultant mixture was stirred for 30 minutes, and 11 parts of a 9.1% aqueous solution (pH adjusted 7.0) of DETA (diethylene triamine) were added and allowed to react for 30 minutes at 25° C., followed by an hour at 40° C.
5. A solution comprising 19.9 parts of CYMEL® 385 and 40 parts of water (pH adjusted to 6.0) was added, and the mixture was allowed to react at 70° C. for an additional 2 hours.
6. 15.23 parts of a 34.3% aqueous of sodium sulfate were added, and the mixture was stirred for 10 minutes, 1.97 parts of CYMEL® 385 and 10 parts of water were added, and the mixture was allowed to react at 70° C. for an additional 1 hour.
7. The mixing speed was reduced to 600 rpm, the pH was adjusted to 9.5 using a 20% NaOH solution, and the resultant reaction mixture was stirred overnight at room temperature.

TABLE 2

| Internal Phase of Photosensitive Sensitive Microcapsule Controls | | | |
|---|---|---|---|
| Ingredients (Dry Parts) | Example 1-1 (Control-B) Blue-sensitive Microcapsule | Example 1-2 (Control-G) Green-sensitive Microcapsule | Example 1-3 (Control-R) Red-sensitive Microcapsule |
| Yellow Leuco Dye ($C_{32}H_{36}O_5$) CAS: 123521-47-1) from Aether industries, India | 20.00 | — | — |
| Blue-sensitive photoinitiator 3-Ethyl-2-[(1-Ethyl-3,3-dimethyl-1,3-dihydro-2H-indol-2-ylidene)-methyl]benzothiazolium (sec-Butyl)triphenylborate | 0.15 | — | — |
| Magenta Leuco Dye (CAS: 50292-95-0 from Synmedia-chem) | — | 30.00 | — |
| Green photoinitiator: (1-heptyl-2-[3-(1-heptyl-3,3-dimethyl-1,3-dihydro-2H-indol-2-ylidene)-propenyl]-3,3-dimethyl-3H-indolium isobutyl triphenyl borate) | | 0.075 | — |
| Cyan Leuco Dye (CAS: 114090-18-5 from NAGASE) | — | — | 13.00 |
| Red-sensitive photoinitiator: 1-Heptyl-2-[5-(1-heptyl-3,3-dimethyl-1,3-dihydro-2H-indol-2-ylidene)-penta-1,3-dienyl]-3,3dimethyl-3H-indolium(sec-Butyl(triphenylborate) | | — | 0.05 |
| TMPTA (trimethylolpropane triacrylate) | | 90.00 | |
| TPGDA (tripropylene glycol diacrylate) | | 10.00 | |
| (EMBT) 6,6'-diethoxy mercaptobenzothiazole disulfide | | 0.50 | |
| THEED (N,N,N',N'-tetrakis(2-hydroxyethyl)ethylenediamine) | | 0.20 | |
| DIDMA (2,6-diisopropyl-N,N-dimethylaniline) | | 3.00 | |
| IRGANOX ® 1035 | | 0.15 | |
| DESMODUR ® N 100 | | 8.00 | |
| DBTDL (dibutyltin dilaurate) | | 0.05 | |

Preparation of Color Developer Coating

The developer composition as shown in Table 3 was coated on a 1 mil, transparent PET film with a Myrad bar and dried in an 80° C. oven for 10 minutes with a target dry coating thickness of about 8 μm as measured by a Mitutoyo thickness gauge.

TABLE 3

Composition of Developer Coating

| Ingredient | Dry parts |
|---|---|
| Resin Developer RD9870A (Richful, China) | 98.00 |
| CAB-O-SPERSE ® 1015A (Cabot, USA) | 0.86 |
| PVA1799 (Sinochem, China) | 1.14 |

Preparation of Microcapsule Coatings

The coating fluids of the R/G/B photosensitive microcapsules (Examples 1-1, 1-2 and 1-3) as shown in Table 4 were adjusted to 33 wt. % solid by D.I. water and coated on a 2 mil, white PET (MELINEX®) with a Myrad bar with a target dry coating thickness of about 8 μm as measured by a Mitutoyo thickness gauge. The coatings were dried in an 80° C. oven for 10 minutes.

TABLE 4

Compositions of Microcapsule Coating Fluids

| Ingredient | Dry parts |
|---|---|
| Blue or Green or Red sensitive microcapsule (45% solid) | 100.00 |
| GSC1202 (50% solid) (Particle size, $D_{50}$ = 11.44 um) | 2.50 |
| Calcium Carbonate (33% solid) (Particle size, $D_{50}$ = 0.12 μm) | 5.00 |
| CELLOSIZET ™ QP-52000H | 0.51 |
| AEROSOL ™ OT | 0.05 |
| TRITON ™ X-114 | 0.20 |
| SILWET ® L*-7001 | 0.20 |
| SILWET ® L*-7604 | 0.20 |
| TAMOL ™ 731 DP | 2.00 |
| JONCRYL ® FLX 5040 | 6.00 |
| Eastman AQ ™ 55S | 8.00 |

Preparation of Imaging Sheets Comprising a Photosensitive Microcapsule Layer and a Develop Layer The microcapsule and the developer films thus prepared were laminated together with a Tamerica roll laminator TCC2700 with the temperature, pressure and speed settings of 100° C., 3.621 Kgf/170 mm and 0.368 m/min, respectively to form various photosensitive imaging sheets.

Example 2. Preparation of Photosensitive Microcapsule with a Color-Filtering Shell and Self-Containing Imaging Sheets Based on the Microcapsules The self-containing imaging sheets comprising various concentration of color-filtering pigment on or in the shell were prepared using the same procedures as those of Example 1 except that in step 4 of the microencapsulation procedure: (i) the resultant mixture was stirred for 30 minutes, (ii) the water-based pigment dispersions as shown in Table 5 and FIG. 5 were thoroughly mixed with 10 parts of D.I. water and added into the mixture, and (iii) 11 parts of a 9.1% aqueous solution (pH adjusted 7.0) of DETA (diethylene triamine) were added and the resultant mixture was allowed to react for 30 minutes at 25° C. followed by an hour at 40° C.

TABLE 5

Color-filtering pigments Grafted or Embedded in or on Microcapsule Shells

| Pigment Dispersion Used (dry phi)* | Example | Green-sensitive Capsules | Red-sensitive Capsules |
|---|---|---|---|
| NW-YOT05 | 1-2 (Control-G) | 0.000 (phi) | — |
| (Pigment Yellow | 2-1 | 0.244 (phi) | — |
| 155) | 2-2 | 0.488 (phi) | — |
| | 2-3 | 0.733 (phi) | — |
| NW-MEA12 | 1-3 (Control-R) | — | 0.000 (phi) |
| (Pigment Violet | 2-4 | — | 0.188 (phi) |
| 19) | 2-5 | — | 0.376 (phi) |
| | 2-6 | — | 0.556 (phi) |

*phi: Parts per hundred internal phase or parts per hundred core by weight

Figure 3A:
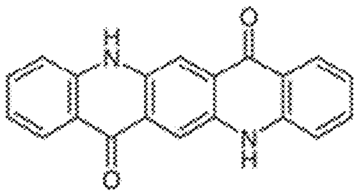
FIGS. 3A-3B show the chemical structures of the pigments used in Example 2, Pigment Yellow 155 (FIG. 3A) and Pigment Violet 19 (FIG. 3B).
Figure 3B:
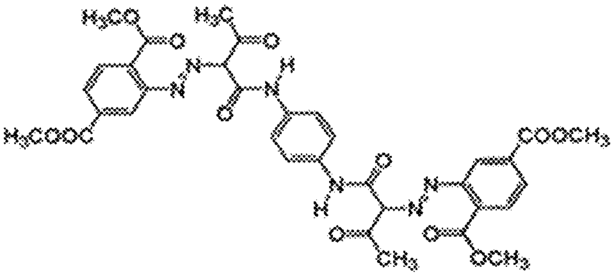

The chemical structures of Pigment Yellow 155 and Pigment Violet 19 are shown in FIG. 3A and FIG. 3B, respectively.

All the microcapsules thus prepared were washed extensively with water and centrifuged to remove the excess of the water-soluble polymers and additives in the aqueous phase. As can be seen clearly from Table 6, all the purified/washed microcapsules show similar particle sizing as measured by HORIBA LA-960 (Laser Scattering Particle Size Distribution Analyzer). No aggregation of microcapsules was observed either.

TABLE 6

Particle Size of Microcapsules As Purified

| Sample | $D_{10}$ (μm) | $D_{50}$ (μm) | $D_{90}$ (μm) |
|---|---|---|---|
| 1-1 (Control-B) | 4.93 | 7.44 | 11.15 |
| 1-2 (Control-G) | 3.75 | 5.78 | 8.55 |
| 1-3 (Control-R) | 3.32 | 5.59 | 8.83 |
| 2-1 (Green-sensitive) | 3.54 | 5.63 | 8.52 |
| 2-2 (Green-sensitive) | 3.67 | 6.07 | 9.48 |
| 2-3 (Green-sensitive) | 3.76 | 6 | 9.18 |
| 2-4 (Red-sensitive) | 3.49 | 5.87 | 9.26 |
| 2-5 (Red-sensitive) | 3.34 | 5.64 | 9.06 |
| 2-6 (Red-sensitive) | 3.3 | 5.61 | 8.96 |

Reduction of Blue-Light Induced Crosstalk of Green-Sensitive Imaging Sheets

The blue-sensitive imaging sheet of Example 1-1 (Control-B) and the green-sensitive imaging sheets of Example 1-2 (Control-G) and Examples 2-1, 2-2 and 2-3 comprising yellow color-filtering shells of various concentration of the yellow pigment 155 were placed directly on a Visionox OLED panel (Model No. G1392FH101GG-003) and exposed for 20 sec through a 0-255 level (where level 0 is the darkest and level 255 is the brightest) RGB gray-scale image. The exposed imaging sheet was developed by a pressure fixture and the normalized reflective optical densities of the developed images as a function of the relative blue energy output (the Blue H-D curves) are shown in FIG. 4.

Figure 4:
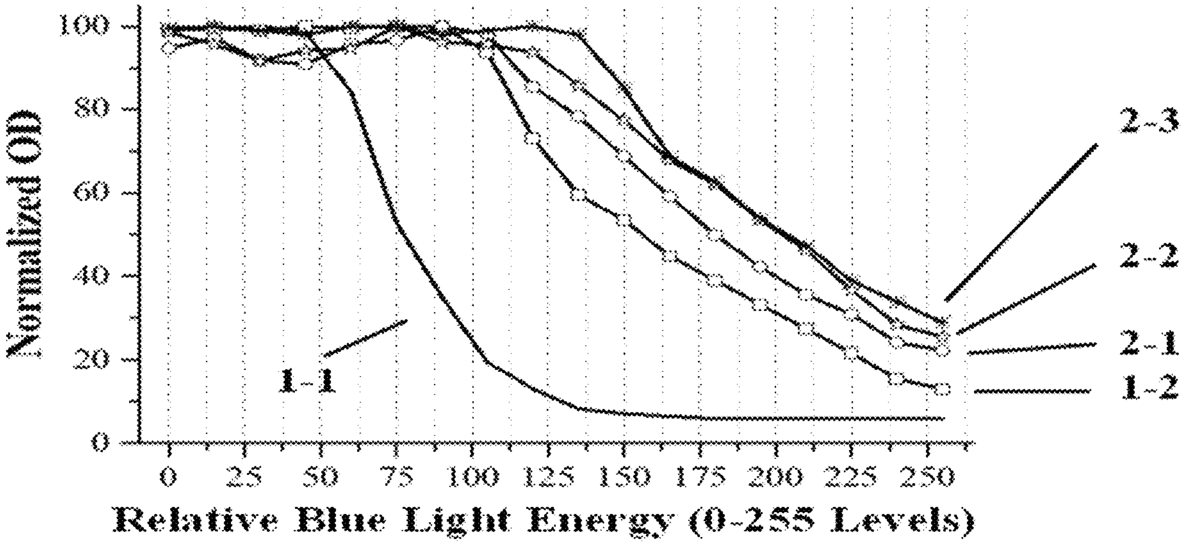
FIG. 4 shows the normalized reflective optical densities (OD) of the developed images as a function of blue-light energy. 1-1 is the yellow OD curve of the blue-sensitive image sheet of Example 1-1 (Control-B) comprising a yellow leuco dye (CAS: 123521-47-1) in the microcapsule core. 1-2 is the magenta OD curve of the green-sensitive image sheet of Example 1-2 (Control-G) comprising a magenta leuco dye (CAS: 50292-95-0) in the microcapsule core. 2-1, 2-2, and 2-3 are the magenta OD curves of the green-sensitive image sheets of Examples 2-1, 2-2 and 2-3 comprising the magenta leuco dye in the core and 0.244 phi, 0.488 phi and 0.733 phi, respectively, of yellow pigment 155 in the shell.

As can be seen from FIG. 4, the green-sensitive imaging sheets (Examples 1-2, 2-1, 2-2 and 2-3) can also be hardened by the blue light from the OLED panel, although their photo-sensitivities were significantly lower than that of the blue-sensitive imaging sheet (Example 1-1, Control-B). It is also evident from FIG. 4 that the imaging sheet of Example 1-2 (Control-G) showed a significant crosstalk by the blue-light exposure. A blue-energy level of about 130 is required to harden the Control-B (Example 1-1) completely to reach the yellow $D_{min}$. At such a high-blue energy level of exposure, the imaging sheet of the Control-G (Example 1-2) was also hardened partially to result in an about 30% decrease of magenta OD. It is also evident from FIG. 4 that the incorporation of yellow pigment 155 into the shell of green-sensitive microcapsules (Examples 2-1, 2-2 and 2-3) resulted in a significant increase of the blue energy required to harden the green-sensitive microcapsules. No decrease in the magenta density was observed for microcapsules comprising ≥0.488 phi of Pigment Yellow 155 after the imaging sheets were exposed with a blue-energy level of about 130. The color-filtering shell comprising Pigment Yellow 155 appeared highly effective to reduce the blue-induced crosstalk of the green-sensitive microcapsules.

The effect of the yellow color-filtering shell comprising various concentration of yellow pigment 155 on the green photosensitivity ($E_{10}$ and $E_{90}$) and $D_{max}$ and $D_{min}$ is shown in Table 7.

Reduction of Green-Light Induced Crosstalk of Red-Sensitive Imaging Sheets

Figure 5:
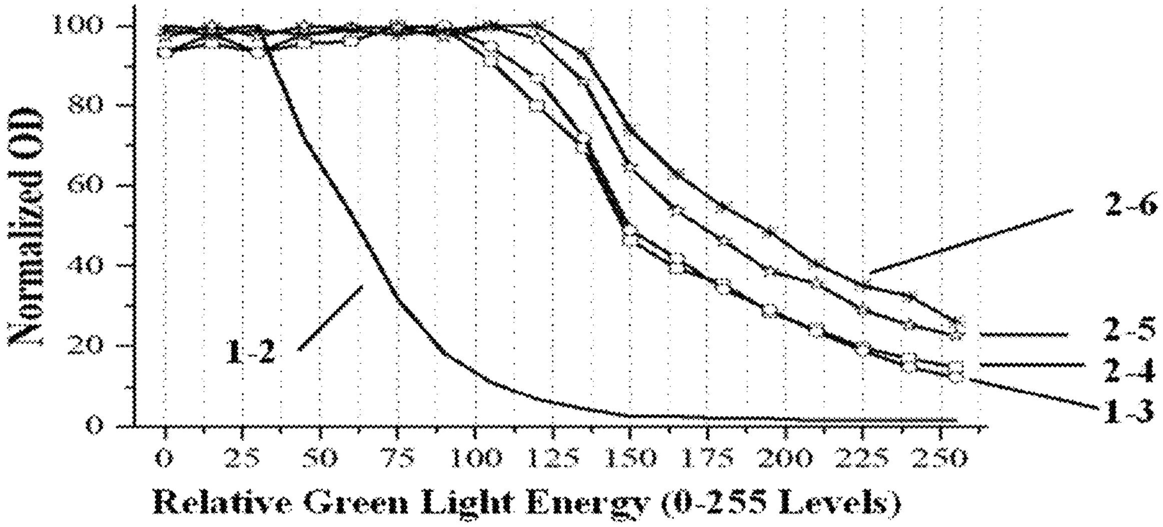
FIG. 5 shows the normalized reflective optical densities (OD) of the developed images as a function of green-light energy. 1-2 is the magenta OD curve of the green-sensitive image sheet of Example 1-2 (Control-G). 1-3 is the cyan OD curve of the red-sensitive image sheet of Example 1-3 (Control-R) comprising a cyan leuco dye (CAS: 114090-18-5) in the microcapsule core. 2-4, 2-5, and 2-6 are the cyan OD curves of the red-sensitive image sheets of Examples 2-4, 2-5 and 2-6 comprising the cyan leuco dye in the core and 0.188 phi, 0.376 phi, and 0.556 phi, respectively of Pigment Violet 19 in the shell.

As can be seen from FIG. 5, the red-sensitive imaging sheets (Examples 1-3, 2-4, 2-5 and 2-6) comprising a cyan leuco dye (CAS: 114090-18-5) are hardenable by the green light from the OLED panel although their photo-sensitivities were significantly lower than that of the green-sensitive imaging sheet (Example 1-2, Control-G) comprising a magenta leuco dye (CAS: 50292-95-0). It is also evident from FIG. 5 that the imaging sheet of Example 1-3 (Control-R) showed a significant crosstalk by the green-light exposure. A green-energy level of about 130-140 is required to harden the Control-G (Example 1-2) completely to reach the magenta $D_{min}$. However, similar to the blue-green crosstalk as discussed earlier, a green-light induced hardening of the red-sensitive microcapsules (crosstalk of red-sensitive imaging sheets by the green light exposure) was also observed at such a high green-energy level of exposure. The imaging sheet of the Control-R (Example 1-3) was also hardened partially to result in an about 30% decrease of cyan OD when the green exposure energy is high enough to reach the magenta $D_{min}$. It is also evident from FIG. 5 that the incorporation of Pigment Violet 29 (a magenta pigment commonly used in inkjet printing) into the shell of red-sensitive microcapsules (Examples 2-4, 2-5 and 2-6) resulted in a significant increase of the green energy required to harden the red-sensitive microcapsules. Little decrease in the cyan density was observed for microcapsules comprising ≥0.376 phi of Pigment Violet 29 (Examples 2-5 and 2-6) even after the imaging sheets were exposed with a green-energy level of about 130 which is high enough to harden the green microcapsule completely to reach the magenta $D_{min}$. The color-filtering shell comprising Pigment Violet 29 also appeared to be highly effective to reduce the green-induced crosstalk of the red-sensitive microcapsules.

TABLE 7

Effect of Yellow Color-Filtering Shell on the Photo-Functions of Green-Sensitive Imaging Sheets

| Example | Yellow 155 added to the shell (phi) | Magenta $D_{min}$ | Yellow $D_{min}$ | Magenta $D_{max}$ | Green $E_{10}$ (Level) | Green $E_{90}$ (Level) | Red Exposure |
|---|---|---|---|---|---|---|---|
| 1-2 (Control-G) | 0 | 0.03 | 0 | 2.08 | 36 | 105 | No reaction |
| 2-1 | 0.244 | 0.03 | 0.06 | 2.16 | 40 (+11.1%) | 98 (−7.3%) | No reaction |
| 2-2 | 0.488 | 0.02 | 0.11 | 2.06 | 40 (+11.1%) | 105 (0%) | No reaction |
| 2-3 | 0.733 | 0.03 | 0.2 | 2.12 | 49 (+36.1%) | 112 (+6.6%) | No reaction |

The definitions of $D_{min}$, $D_{max}$, $E_{10}$, and $E_{90}$ are as below:
$D_{min}$: The average minimum reflective color (cyan, magenta or yellow) density in the fully exposed area
$D_{max}$: The average maximum color (cyan, magenta or yellow) density developed in the non-exposed area
$E_{10}$ (Level): Energy level (0-255) required to reduce total density ($D_{max}$ − $D_{min}$) by 10%
$E_{90}$ (Level): Energy level (0-255) required to reduce total density ($D_{max}$ − $D_{min}$) by 90%.

All the optical density were measured by spectrodensitometer FD-5 (Konica Minolta, MO, ISO-E) immediately after exposure, pressure development and post-heating through a heating roller at 100° C.

Table 7 shows that the color-filtering shell comprising ≤0.488 phi of Pigment Yellow 155 did not show any noticeable impact (or within experimental error) on almost all photo-functions including magenta $D_{min}$, yellow $D_{min}$, magenta $D_{max}$, Green $E_{10}$ and $E_{90}$. The microcapsules comprising a high concentration (≥0.733 phi) of Pigment Yellow 155 (a yellow pigment commonly used in inkjet printing) in the shell showed slight increases in yellow $D_{min}$ and green-$E_{10}$. Without being bound by theory, it is believed that too high a concentration of the yellow pigment might cause a deterioration of the crosslinking and/or the barrier property of the shell against oxygen and result in an increase in $E_{10}$ (that is, a decrease in the onset photospeed).

Table 7 also shows that no hardening of all the green-sensitive imaging sheet was observed after they were fully exposed with the highest level of red light. This effect is attributable to the very limited overlap of the red emission spectrum of OLED used and the absorption spectrum of the green-photoinitiator.

Figure 6:
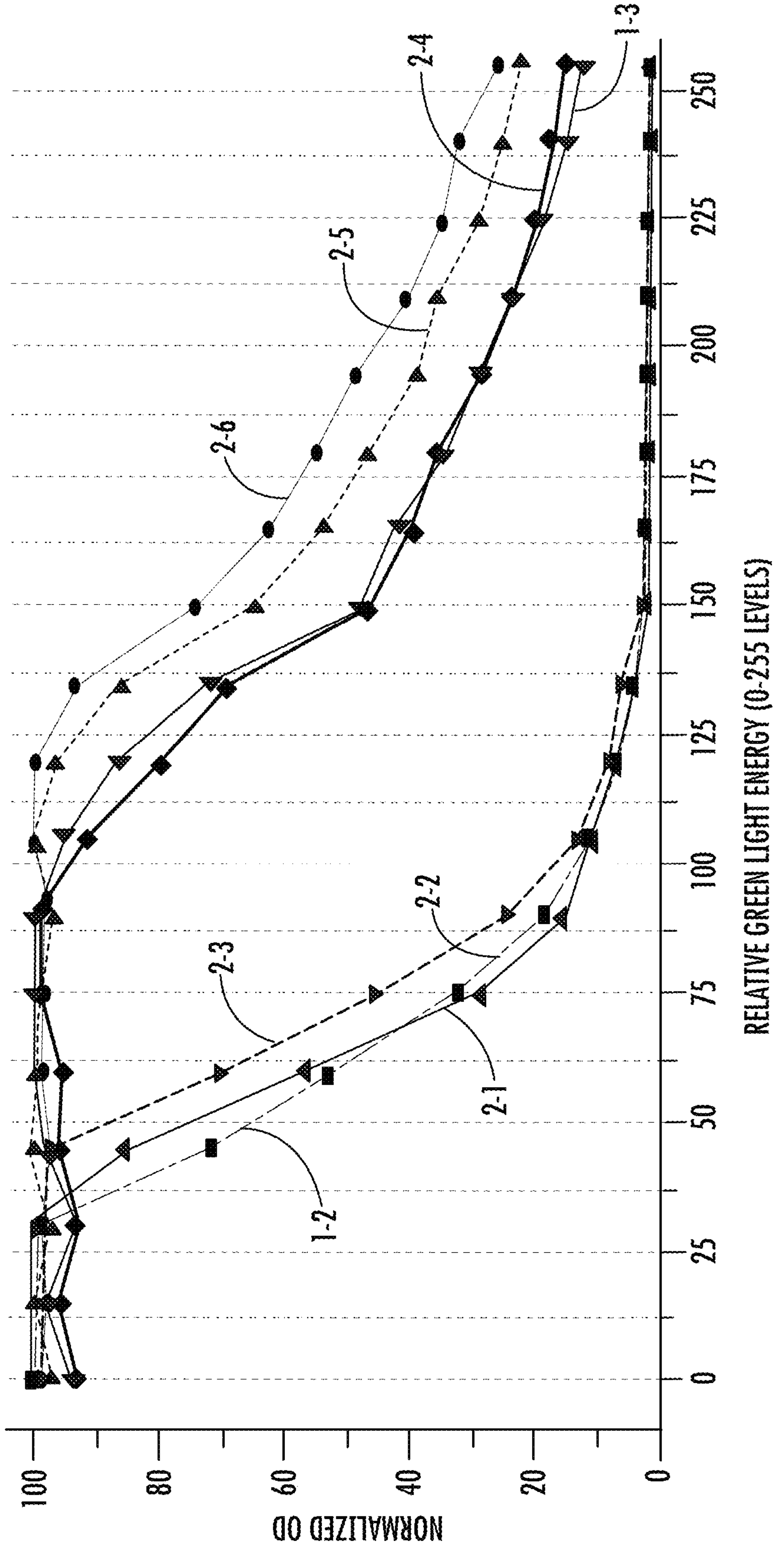
FIG. 6 shows the normalized reflective optical densities (OD) of the developed images as a function of green-light energy. 1-2 is the magenta OD curve of the green-sensitive image sheet of Example 1-2 (Control-G). 1-3 is the cyan OD curve of the red-sensitive image sheet of Example 1-3 (Control-R). 2-4, 2-5, and 2-6 are cyan OD curves of the red-sensitive image sheets of Examples 2-4, 2-5 and 2-6 with 0.188 phi, 0.376 phi, and 0.556 phi, respectively of Pigment Violet 19 in the shell. 2-1, 2-2, and 2-3 are magenta OD curves of the green-sensitive image sheets of Examples 2-1, 2-2 and 2-3 with 0.244 phi, 0.488 phi and 0.733 phi, respectively of yellow pigment 155 in the shell.

FIG. 6 shows the OD curves of Examples 1-2 (Control-G), 1-3 (Control-R) and Examples 2-1 to 2-6 as a function green-light exposure. As evident from FIG. 6, the yellow color-filtering shell (Examples 2-1, 2-2 and 2-3) showed essentially no impact on the green-energy required to reach Magenta $D_{min}$ of all the four the green-sensitive imaging sheets even with the highest loading (0.733 phi) of Pigment Yellow 155 in the shell. As a result, the incorporation of the yellow pigment in the green-sensitive microcapsule shell showed no impact on the green-crosstalk on the red-sensitive microcapsules and yet, as shown in FIG. 4, it effectively reduced the blue-induce crosstalk of the green-sensitive microcapsules.

The effect of magenta color-filtering shell on the red-photosensitivity ($E_{10}$ and $E_{90}$) and $D_{max}$ and $D_{min}$ of red-sensitive imaging sheets comprising a cyan leuco dye (CAS: 114090-18-5) is shown in Table 8.

As can be seen from Table 8, the color-filtering shell comprising ≤0.556 phi of Pigment Violet 29 did not show significant impact (or within experimental error) on almost all photo-functions including cyan $D_{min}$, magenta $D_{min}$, cyan $D_{max}$, and red-$E_{90}$. The microcapsules (Examples 2-6) comprising a high concentration (≥0.556 phi) of Pigment Violet 29 (a magenta pigment commonly used in inkjet printing) in the shell showed slight increases in magenta $D_{min}$ and Red-$E_{10}$, potentially because of the deterioration of the crosslinking and/or the barrier property of the shell against oxygen by the high loading of the pigment. It is also noted from Table 8 that no hardening of all the red-sensitive imaging sheet was observed after they were fully exposed with the highest level of blue light, mainly because the blue emission spectrum of OLED used does not overlap with the absorption spectrum of the red-photoinitiator.

TABLE 8

Effect of Magenta Color-Filtering Shell on the Photo-functions of Red-Sensitive Imaging Sheets

| Example | Violet 29 added to the shell (phi) | Cyan $D_{min}$ | Magenta $D_{min}$ | Cyan $D_{max}$ | Red-$E_{10}$ (level) | Red-$E_{90}$ (level) | Blue-light Exposure |
|---|---|---|---|---|---|---|---|
| 1-3 (Control-R) | 0.000 | 0.03 | 0.00 | 1.89 | 42 | 114 | No Reaction |
| 2-4 | 0.188 | 0.04 | 0.05 | 1.92 | 50 (+19.0%) | 114 (0%) | No Reaction |
| 2-5 | 0.376 | 0.06 | 0.11 | 1.98 | 50 (+19.0%) | 118 (+3.5%) | No Reaction |
| 2-6 | 0.556 | 0.07 | 0.13 | 1.97 | 51 (+21.4%) | 123 (+7.9%) | No Reaction |

Example 3 Green- and Red-Sensitive Microcapsules Comprising a Color-Filtering Pigment in the Shell and a High Concentration of Radical Quencher in the Core The compositions of the internal phase of the green- and red-sensitive microcapsules and the procedures for the making of microcapsules and imaging sheets are the same as those described in Examples 1 and 2 except that a high concentration (0.3-0.6 parts per hundred monomer or phm) of antioxidant IRGANOX® 1035 from BASF were added as a radical quencher or polymerization retarder/inhibitor into the cores of microcapsules. Except for the concentration of IRGANOX® 1035, the formulation of the internal phase of the green-sensitive microcapsules of Examples 3-1 and 3-2 are the same as that of Examples 2-3. Similarly, except for the concentration of IRGANOX® 1035, the formulation of the internal phase of the red-sensitive microcapsules of Examples 3-3 and 3-4) are the same as that of Example 1-3. The differences in the formulations and the $D_{50}$ particle size of the microcapsules prepared accordingly are shown in Table 9. Imaging sheets based on the microcapsules were prepared using the procedures as described in Example 2 and the characteristic photo-function of the imaging sheets are shown in Tables 10 and 11 and FIGS. 7 and 8.

TABLE 9

Microcapsules Comprising Antioxidant IRGANOX ® 1035 in the Core and Color Filtering Pigment in the Shell

| Ingredients | Example 2-3 Green-sensitive | Example 3-1 Green-sensitive | Example 3-2 Green-Sensitive | Example 2-6 Red-Sensitive | Example 3-3 Red-Sensitive | Example 3-4 Red-Sensitive |
|---|---|---|---|---|---|---|
| IRGANOX ® 1035 in Internal Phase (phm) | 0.15 | 0.30 | 0.60 | 0.15 | 0.30 | 0.60 |
| Color-Filtering Pigment in the Shell | | | | | | |
| Yellow 155 (phi) | 0.733 | 0.733 | 0.733 | — | — | — |
| Violet 19 (phi) | — | — | — | 0.556 | 0.556 | 0.556 |
| Average Capsule Size ($D_{50}$), μm | 6.00 | 5.89 | 5.91 | 5.61 | 4.97 | 6.28 |

TABLE 10

Effect of Antioxidant IRGANOX ® 1035 in the Core on the Photo-functions of Green-Sensitive Imaging Sheets Comprising 0.733 Phi of Yellow 155 in the Shell

| Example | Yellow 155 in the shell (phi) | Irganox 1035 in the core (phm) | Magenta Dmin | Yellow Dmin | Magenta Dmax | Green $E_{10}$ (Level) | Green $E_{90}$ (Level) | Red-light Exposure |
|---|---|---|---|---|---|---|---|---|
| 2-3 | 0.733 | 0.15 | 0.03 | 0.2 | 2.12 | 49 | 112 | No reaction |
| 3-1 | 0.733 | 0.3 | 0.04 | 0.21 | 2.11 | 53 (+8.1%) | 107 (−4.5%) | No reaction |
| 3-2 | 0.733 | 0.6 | 0.04 | 0.19 | 2.1 | 52 (+6.1%) | 98 (−12.5%) | No reaction |

TABLE 11

Effect of Antioxidant IRGANOX ® 1035 in the Core on the Photo-functions of Red-sensitive Imaging Sheets Comprising 0.566 Phi of Violet 19 in the Shell

| Example | Violety 19 in the shell (phi) | Irganox 1035 in the core (phm) | Cyan Dmin | Magenta Dmin | Cyan Dmax | Red $E_{10}$ (Level) | Red $E_{90}$ (Level) | Blue-light Exposure |
|---|---|---|---|---|---|---|---|---|
| 2-6 | 0.556 | 0.15 | 0.07 | 0.13 | 1.97 | 51 | 123 | No reaction |
| 3-3 | 0.556 | 0.3 | 0.08 | 0.14 | 1.91 | 54 (+5.9%) | 115 (−6.5%) | No reaction |
| 3-4 | 0.556 | 0.6 | 0.06 | 0.13 | 1.92 | 67 (+31.4%) | 105 (−14.6% | No reaction |

As evident from Tables 9, 10 and 11, the increase of the concentration of the radical quencher IRGANOX® 1035 from 0.15 phm to 0.60 phm in the core did not show any noticeable impact on particle size of the microcapsules, $D_{min}$ and $D_{max}$. However, for the green-sensitive microcapsules comprising 0.733 phi of color-filtering Yellow 155 in the shell, it resulted in a H-D curve of a higher contrast ratio with a 6.1-8.1% increase in $E_{10}$ (a decrease in photospeed for the onset of the hardening of the microcapsules) and a 4.5-12.5% decrease in the $E_{90}$ (an increase in the photospeed to reach the almost fully-hardened state of the microcapsules). Similarly, for the red-sensitive microcapsules comprising 0.566 phi of color-filtering Violet 19 in the shell, it resulted in a H-D curve of an even more significantly higher contrast ratio with a 5.9-31.4% increase in $E_{10}$ and a 6.5-14.6% decrease in the $E_{90}$. The significant alleviation of undesirable crosstalk is evident from the H-D curves shown in FIGS. 7A and 7B.

Figure 7A:
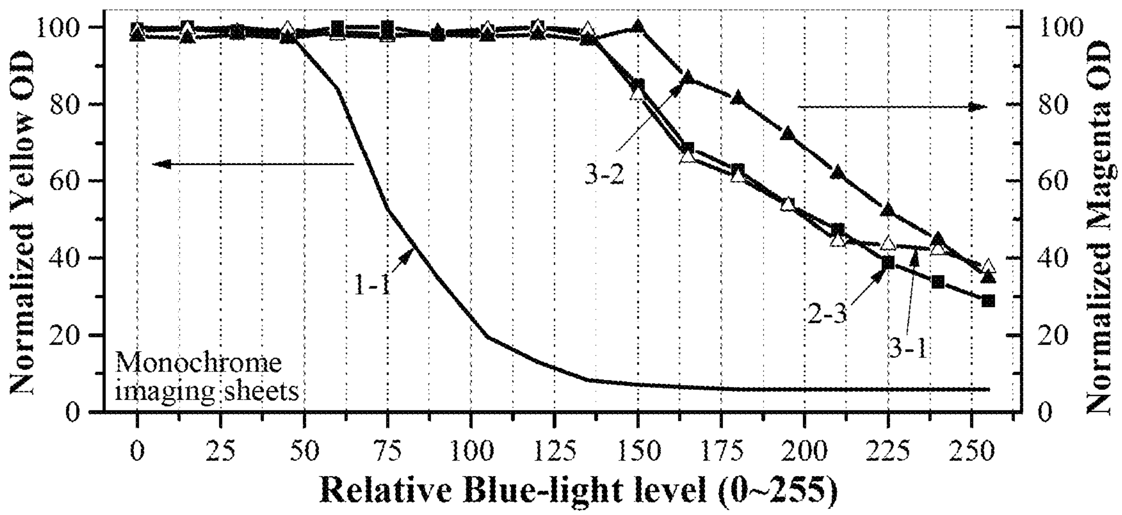
FIG. 7A shows the normalized reflective optical densities (OD) of the developed images as a function of blue-light energy. 1-1 is the yellow OD curve of the blue-sensitive image sheet of Example 1-1 (Control-B). 2-3, 3-1 and 3-2 are the magenta OD curves of the green-sensitive image sheets of Examples 2-3, 3-1 and 3-2 comprising 0.15 phm, 0.3 phm and 0.6 phm, respectively of antioxidant IRGANOX® 1035 in the core and 0.733 phi of color-filtering Yellow 155 in the shell.

The blue-sensitive imaging sheet of Example 1-1 (Control-B) and the green-sensitive imaging sheets of Examples 2-3, 3-1 and 3-2 comprising 0.15, 0.3 and 0.6 phm, respectively of IRGANOX® 1035 as the radical quencher in the core and 0.733 phi of Yellow 155 in the shell were exposed with the blue light from a Visionox OLED panel as described in Example 2. As shown in FIG. 7A, at the blue energy level of about 130-140, the blue-sensitive Control-B (Example 1-1) reached yellow Dmin. However, at the same level of blue exposure energy, the two green-sensitive imaging sheets, Examples 2-3 and 3-1, showed a similar decrease in OD, and the imaging sheet of Example 3-2 with the highest concentration (0.60 phm) of IRGANOX® did not shown any decrease in OD until the blue energy level was higher than about level 150. It is evident from both Table 10 and FIG. 7A that the increase in the concentration of IRGANOX® 1035 from 0.15 phm to 0.60 phm resulted in a significant reduction of the blue crosstalk of the green-sensitive imaging sheet without a noticeable trade-off in the magenta $D_{max}$ and $D_{min}$.

Figure 7B:
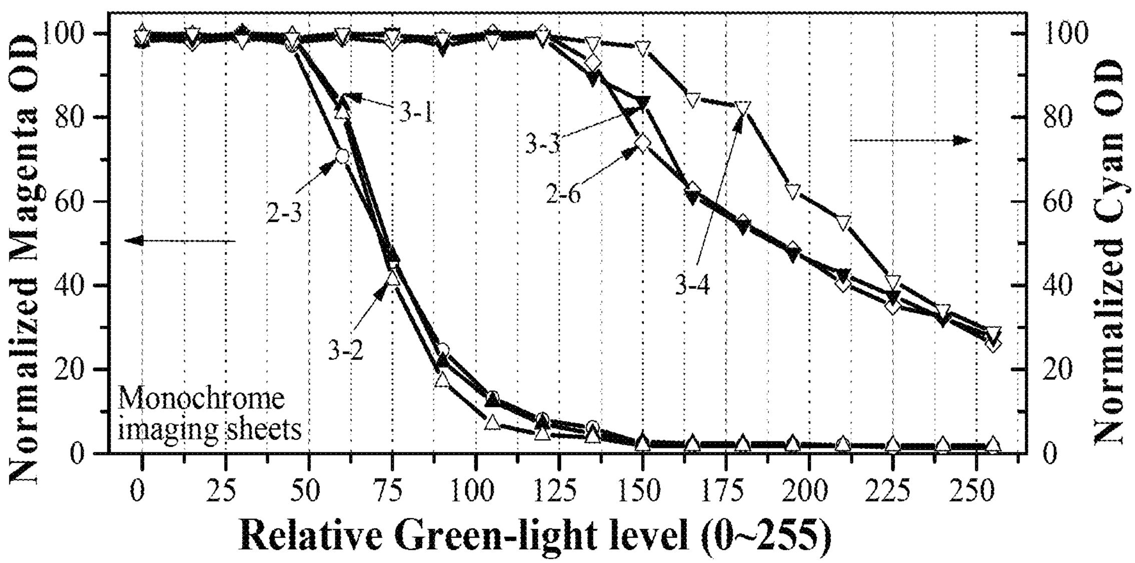
FIG. 7B shows the normalized reflective optical densities (OD) of the developed images as a function of green-light energy. 1-1 is the yellow OD curve of the blue-sensitive image sheet of Example 1-1 (Control-B). Curves 2-3, 3-1 and 3-2 are the magenta OD curves of the green-sensitive image sheets of Examples 2-3, 3-1 and 3-2. Curves 2-6, 3-3 and 3-4 are the cyan OD curves of Examples 2-6, 3-3 and 3-4 comprising 0.15 phm, 0.3 phm and 0.6 phm, respectively of antioxidant IRGANOX® 1035 in the core and 0.566 phi of color-filtering Violet 19 in the shell.

The effect the IRGANOX® 1035 concentration in the core of the red-sensitive imaging sheets (Examples 2-6, 3-3 and 3-4) with 0.566 phi of color-filtering Violet 19 in the microcapsule shell on the green crosstalk can also be clearly seen in FIG. 7B and Table 11. The addition of 0.60 phm of IRGANOX® 1035 in the core of the red-sensitive microcapsules also resulted in a significant reduction of the green crosstalk without any trade-off in the cyan $D_{max}$ and $D_{min}$.

Example 4. Green- and Red-Sensitive Imaging Sheets Comprising a Color-Filtering Pigment in the Microcapsule Core The formulations and procedures of making the self-containing imaging sheets of Examples 3-2 (green-sensitive) and 3-4 (red-sensitive) were repeated except that the color-filtering pigment Yellow 155 (0.733 phi) and Violet 19 (0.566 phi) were ground and dispersed in the internal phase and encapsulated for Example 4-1 and 4-2, respectively. The results are shown in Table 12.

TABLE 12

Effect of Color-Filtering Dyes/Pigments in the Core Versus in The Shell

| Green-Sensitive Example | Yellow 155 in Shell (phi) | Yellow 155 in Core (phi) | Irganox 1035 in Core (phm) | Magenta Dmin | Yellow Dmin | Magenta Dmax | Green $E_{10}$ (Level) | Green $E_{90}$ (Level) | Red-Light Exposure |
|---|---|---|---|---|---|---|---|---|---|
| 3-2 | 0.733 | — | 0.6 | 0.04 | 0.19 | 2.1 | 52 | 98 | No reaction |
| 4-1 | — | 0.733 | 0.6 | 0.04 | 0.28 | 2.12 | 59 | 119 | No reaction |

| Red-Sensitive Example | Violet 19 in Shell (phi) | Violet 19 in Core (phi) | Irganox 1035 in Core (phm) | Cyan Dmin | Magenta Dmin | Cyan Dmax | Red $E_{10}$ (Level) | Red $E_{90}$ (Level) | Blue-light Exposure |
|---|---|---|---|---|---|---|---|---|---|
| 3-4 | 0.566 | — | 0.6 | 0.06 | 0.13 | 1.92 | 67 | 105 | No reaction |
| 4-2 | — | 0.566 | 0.6 | 0.05 | 0.29 | 1.9 | 53 | 124 | No reaction |

As it can be seen clearly from Table 12 that the green-sensitive imaging sheet (Examples 3-2) comprising the yellow 155 color-filtering pigment in the shell show a significantly lower yellow $D_{min}$ and a sharper contrast ratio (a smaller $E_{90}$-$E_{10}$) than those of the imaging sheets comprising the same yellow pigment in the core (Example 4-1). It is evident that a higher concentration the yellow pigments were transferred to the developer layer in the development step and resulted in a higher yellow $D_{min}$ when it is included in the core. Moreover, the presence of the pigment in the core also resulted in a slower photospeed (a higher $E_{90}$) to reach the $D_{min}$ or the fully cured state of the internal phase. Without being bound by the theory, it is believed that the pigments included in the shell tend to be immobilized in the highly crosslinked shell and resulted in a lower yellow $D_{min}$ as illustrated in the schematic drawing of FIG. 2. Also, since the pigment was not in contact with the monomer in the internal phase, it has less impact on the polymerization or crosslinking of the multifunctional monomers in the core.

A lower magenta $D_{min}$ and a sharper contrast ratio were also observed for the red-sensitive imaging sheet of Example 3-4 in which the Violet 19 pigment was incorporated in the shell than those of the imaging sheets of Example 4-2 in which the color filtering pigment was dispersed in the core.

The compositions and methods illustratively described herein may suitably be practiced in the absence of any element or elements, limitation or limitations, not specifically disclosed herein. Thus, for example, the terms "comprising", "including," containing", etc. shall be read expansively and without limitation. Additionally, the terms and expressions employed herein have been used as terms of description and not of limitation, and there is no intention in the use of such terms and expressions of excluding any equivalents of the features shown and described or portions thereof. It is recognized that various modifications are possible within the scope of the disclosure claimed. Thus, it should be understood that although the present disclosure has been specifically disclosed by preferred embodiments and optional features, modification and variation of the disclosure embodied therein herein disclosed may be resorted to by those skilled in the art, and that such modifications and variations are considered to be within the scope of this disclosure.

Unless the context indicates otherwise, it is specifically intended that the various features of the invention described herein can be used in any combination. Moreover, the disclosure also contemplates that in some embodiments, any feature or combination of features set forth herein can be excluded or omitted. To illustrate, if the specification states that a complex comprises components A, B and C, it is specifically intended that any of A, B or C, or a combination thereof, can be omitted and disclaimed singularly or in any combination.

The disclosure has been described broadly and generically herein. Each of the narrower species and subgeneric groupings falling within the generic disclosure also form part of the compositions or methods. This includes the generic description of the compositions or methods with a proviso or negative limitation removing any subject matter from the genus, regardless of whether or not the excised material is specifically recited herein. The present technology is not to be limited in terms of the particular embodiments described in this application, which are intended as representative illustrations of individual aspects of the present technology. Many modifications and variations of this present technology can be made without departing from its spirit and scope, as will be apparent to those skilled in the art. Functionally equivalent compositions, methods, and devices within the scope of the present technology, in addition to those enumerated herein, will be apparent to those skilled in the art from the foregoing descriptions. Such modifications and variations are intended to fall within the scope of the present technology. It is to be understood that this present technology is not limited to particular methods, compounds or compositions, which can, of course, vary. It is also to be understood that the terminology used herein is for the purpose of describing particular embodiments only, and is not intended to be limiting.

One skilled in the art would readily appreciate that the present disclosure is well adapted to carry out the objects and obtain the ends and advantages mentioned, as well as those inherent therein. Modifications therein and other uses will occur to those skilled in the art. These modifications are encompassed within the spirit of the disclosure and are defined by the scope of the claims, which set forth non-limiting embodiments of the disclosure.

In addition, where features or aspects of the disclosure are described in terms of Markush groups, those skilled in the art will recognize that the disclosure is also thereby described in terms of any individual member or subgroup of members of the Markush group.

What is claimed is:

1. A photosensitive microcapsule for a microcapsule imaging sheet, comprising:

a color-filtering shell, and a core comprising a leuco dye or dye precursor, a photoinitiator or photosensitizer, and a photohardenable or photosoftenable material, wherein the photoinitiator is a borate of cyanine, semicyanine, triarylmethane, squarylium or thiopyrylium dyes, wherein the photosensitive microcapsule is sensitive to a specific color or a specific range of radiation spectrum, and the shell comprises one or more of a color-filtering dye or pigment that allows a wavelength corresponding to the specific color or the specific range of radiation spectrum to pass through to the core but selectively absorbs or filters all or a portion of the radiation spectrum outside of the specific color or the specific range, and wherein the one or more of the color-filtering dye or pigment comprises a functional group that has reacted with one or more shell-forming materials to form the shell.

2. The photosensitive microcapsule of claim 1, wherein the photoinitiator or photosensitizer is red-sensitive and the color of the color filtering shell is magenta, yellow or a combination thereof.

3. The photosensitive microcapsule of claim 2, wherein the one or more color-filtering dye or pigment absorbs green and/or blue light.

4. The photosensitive microcapsule of claim 1, wherein the photoinitiator or photosensitizer is green-sensitive and the color of the color-filtering shell is cyan, yellow, or a combination thereof.

5. The photosensitive microcapsule of claim 4, wherein the one or more color-filtering dye or pigment absorbs red and/or blue light.

6. The photosensitive microcapsule of claim 1, wherein the photoinitiator or photosensitizer is blue-sensitive and the color of the color-filtering shell is magenta, cyan, or a combination thereof.

7. The photosensitive microcapsule of claim 6, wherein the one or more color-filtering dye or pigment absorbs red and/or green light.

8. The photosensitive microcapsule of claim 1, wherein the photoinitiator or photosensitizer is IR-sensitive and the color of the color-filtering shell is cyan, magenta, yellow or any combination thereof.

9. The photosensitive microcapsule of claim 1, wherein the photohardenable material comprises a photopolymerizable or crosslinkable monomer or oligomer.

10. The photosensitive microcapsule of claim 9, wherein the photopolymerizable or crosslinkable monomer or oligomer is selected from a multifunctional acrylate or methacrylate, multifunctional vinyl ether, multifunctional allyl or vinylbenzene, oligomers thereof, dendrimers thereof and blends thereof.

11. The photosensitive microcapsule of claim 1, wherein the photosoftenable material comprises a photodegradable or photo-depolymerizable polymer.

12. The photosensitive microcapsule of claim 1, wherein the leuco dye is a cyan, magenta, yellow, black leuco dye, or any combination thereof.

13. The photosensitive microcapsule of claim 1, wherein the photoinitiator or photosensitizer comprises a UV-sensitive, blue-sensitive, green-sensitive, red-sensitive or near-IR-sensitive photoinitiator or photosensitizer.

14. The photosensitive microcapsule of claim 1, wherein the one or more of the color-filtering dye or pigment is bleachable, including thermally bleachable or photo-bleachable.

15. The photosensitive microcapsule of claim 1, wherein the functional group is selected from the group consisting of —OH, —SH, —$NH_2$, —N—HR, —$CONH_2$, —NCO, —NCS—, —$CH_2OH$, —$CH_2OR$, and —CHO wherein R is alkyl, aryl, arylalkyl, or alkylaryl.

16. The photosensitive microcapsule of claim 1, wherein the one or more shell-forming materials are included in an internal phase and/or an external phase and form the shell by interfacial polymerization or crosslinking during a microencapsulation process.

17. The photosensitive microcapsule of claim 1, wherein the one or more shell-forming materials are included in an external phase and form the shell by in-situ polymerization or crosslinking, phase separation, coacervation, or a combination thereof during a microencapsulation process.

18. The photosensitive microcapsule of claim 1, wherein the one or more of the color-filtering dye or pigment present in the microcapsule is in an amount of from about 0.01 to about 3 parts per hundred by weight of the core or parts per hundred by weight of an internal phase.

19. The photosensitive microcapsule of claim 1, wherein when the photosensitive microcapsules are green-sensitive or red-sensitive microcapsules and the one or more of the color-filtering dye or pigment is a yellow or blue-absorbing color-filtering dye or pigment, the absorption optical density of the shell is from about 0.005 to about 0.3 in the 450 to 500 nm range.

20. The photosensitive microcapsule of claim 1, wherein when the photosensitive microcapsules are blue-sensitive or red-sensitive microcapsules and the one or more of the color-filtering dye or pigment is a magenta or green-absorbing color-filtering dye or pigment, the absorption optical density of the shell is from about 0.005 to 0.3 in the 500 to 600 nm range.

21. The photosensitive microcapsule of claim 1, wherein the core does not comprise any color-filtering dye or pigment.

22. The photosensitive microcapsule of claim 1, wherein the core further comprises a radical inhibitor, retarder or antioxidant.

23. The photosensitive microcapsule of claim 22, wherein the radical inhibitor, antioxidant, or retarder is selected from a group comprising phenols, anilines, N-oxide of hindered amines, CuO, copper dithiocarbamate, copper or manganese carboxylates, and thiuram derivatives, including

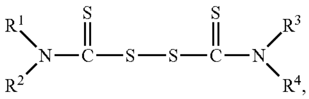

wherein $R^1$, $R^2$, $R^3$, and $R^4$ are each independently an alkyl group having the carbon number of 1 to 8 or a phenyl group.

24. The photosensitive microcapsule of claim 22, wherein the radical inhibitor, retarder or antioxidant is present in a concentration of from about 0.1 to about 1.0 parts per hundred by weight of monomers in an internal phase.

25. The photosensitive microcapsule of claim 24, wherein the radical inhibitor, retarder or antioxidant is present in a concentration of from about 0.3 to 0.8 parts per hundred by weight of monomers in the internal phase.

26. The photosensitive microcapsule of claim 1, wherein the core further comprises a co-initiator, an oxygen scavenger or an auto-oxidizer.

27. The photosensitive microcapsule of claim 1, wherein when the photosensitive microcapsules are green-sensitive microcapsules and the one or more of the color-filtering dye or pigment is a cyan or red-absorbing color-filtering dye or pigment, the absorption optical density of the shell is from about 0.005 to about 0.3 in the 600-650 nm range.

28. A microcapsule imaging sheet, comprising:

a first substrate, and a photosensitive microcapsule layer comprising photosensitive microcapsules in contact with a first surface of the first substrate, wherein the photosensitive microcapsules comprise:

a color-filtering shell, and a core comprising a leuco dye, a photoinitiator or photosensitizer, and a photohardenable or photosoftenable material, wherein the photoinitiator is a borate of cyanine, semicyanine, triarylmethane, squarylium or thiopyrylium dyes, and wherein the photosensitive microcapsule is sensitive to a specific color or a specific range of radiation spectrum, and the shell comprises one or more of a color-filtering dye or pigment that allows a wavelength corresponding to the specific color or the specific range of radiation spectrum to pass through to the core but selectively absorbs or filters all or a portion of the radiation spectrum outside of the specific color or the specific range, and wherein the one or more of the color-filtering dye or pigment comprises a functional group that has reacted with one or more shell-forming materials to form the shell.

29. The microcapsule imaging sheet of claim 28, wherein the microcapsule imaging sheet is a full-color imaging sheet, wherein the photosensitive microcapsule layer includes red-sensitive, green-sensitive, and blue-sensitive microcapsules.

30. The microcapsule imaging sheet of claim 28, wherein the photosensitive microcapsule layer further comprises a developer.

31. The microcapsule imaging sheet of claim 28, further comprising a developer layer in contact with or adjacent to the photosensitive microcapsule layer.

32. The microcapsule imaging sheet of claim 28, further comprising a developer layer in contact with: (i) the microcapsule layer; and/or (ii) a developer substrate.

33. The microcapsule imaging sheet of claim 32, wherein the developer substrate is a polyethylene terephthalate (PET), polyethylene naphthalate (PEN), polycarbonate, polyolefins, cyclic olefin copolymers (COC), cellulose acetates, or a copolymer, blend or composite thereof.

34. A method of imaging or printing, the method comprising:

image-wise exposing an imaging sheet according to claim 28 to heat or radiation, wherein the exposing is sufficient to harden or soften the microcapsules in the microcapsule layer to produce a latent image, and developing the latent image by pressure and/or heat to release the leuco dye and form an image.

* * * * *